US012808659B2

(12) United States Patent
Takeyama et al.

(10) Patent No.: US 12,808,659 B2
(45) Date of Patent: Nov. 24, 2026

(54) LIGHT EMITTING DEVICE AND MEASUREMENT APPARATUS

(71) Applicant: FUJIFILM Business Innovation Corp., Tokyo (JP)

(72) Inventors: Kei Takeyama, Kanagawa (JP); Daisuke Iguchi, Kanagawa (JP); Seiji Ono, Kanagawa (JP); Tomoaki Sakita, Kanagawa (JP); Takashi Kondo, Kanagawa (JP); Junichiro Hayakawa, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 876 days.

(21) Appl. No.: 17/976,879

(22) Filed: Oct. 31, 2022

(65) Prior Publication Data

US 2023/0304789 A1 Sep. 28, 2023

(30) Foreign Application Priority Data

Mar. 22, 2022 (JP) ................................ 2022-045915

(51) Int. Cl.
*H01S 5/042* (2006.01)
*G01B 11/24* (2006.01)
*H01S 5/42* (2006.01)

(52) U.S. Cl.
CPC ............ *G01B 11/24* (2013.01); *H01S 5/0428* (2013.01); *H01S 5/423* (2013.01)

(58) Field of Classification Search
None
See application file for complete search history.

(56) References Cited

U.S. PATENT DOCUMENTS

| | | | | |
|---|---|---|---|---|
| 9,368,936 | B1 * | 6/2016 | Lenius | G01S 7/484 |
| 10,451,993 | B2 * | 10/2019 | Kondo | G03G 15/04054 |
| 11,923,658 | B1 * | 3/2024 | Lenius | H05B 47/00 |
| 12,132,295 | B2 * | 10/2024 | Kondo | G01S 7/484 |
| 12,200,833 | B2 * | 1/2025 | Ono | H05B 44/00 |
| 2012/0251181 | A1 | 10/2012 | Nagumo | |
| 2019/0086831 | A1 * | 3/2019 | Kondo | G03G 15/04054 |
| 2020/0096895 | A1 * | 3/2020 | Ono | G03G 15/04036 |
| 2021/0296861 | A1 * | 9/2021 | Kondo | G06V 20/64 |
| 2023/0243934 | A1 * | 8/2023 | Ono | G01S 7/4815 356/5.01 |
| 2023/0246414 | A1 * | 8/2023 | Ono | G01S 17/10 356/4.01 |

(Continued)

FOREIGN PATENT DOCUMENTS

| | | |
|---|---|---|
| JP | 2012206485 | 10/2012 |
| JP | 2018030319 | 3/2018 |

(Continued)

OTHER PUBLICATIONS

"Office Action of Japan Counterpart Application", issued on Aug. 27, 2024, with English translation thereof, pp. 1-5.

*Primary Examiner* — Tod T Van Roy
(74) *Attorney, Agent, or Firm* — JCIPRNET

(57) ABSTRACT

A light emitting device includes: a light emitting section that includes a light emitting element; a capacitor section connected to the light emitting section; and a control section that controls a potential of the capacitor section when the light emitting element of the light emitting section emits light.

18 Claims, 18 Drawing Sheets

(56) References Cited

U.S. PATENT DOCUMENTS

| | | | | |
|---|---|---|---|---|
| 2023/0247737 | A1* | 8/2023 | Ono | H01S 5/423<br>315/363 |
| 2023/0304789 | A1* | 9/2023 | Takeyama | G01S 17/10 |
| 2024/0106194 | A1* | 3/2024 | Iguchi | H01S 5/0428 |
| 2025/0239832 | A1* | 7/2025 | Iguchi | H01S 5/0261 |

FOREIGN PATENT DOCUMENTS

| | | |
|---|---|---|
| JP | 2019057652 | 4/2019 |
| JP | 2020049720 | 4/2020 |
| JP | 2021150388 | 9/2021 |

* cited by examiner

FIG. 7A
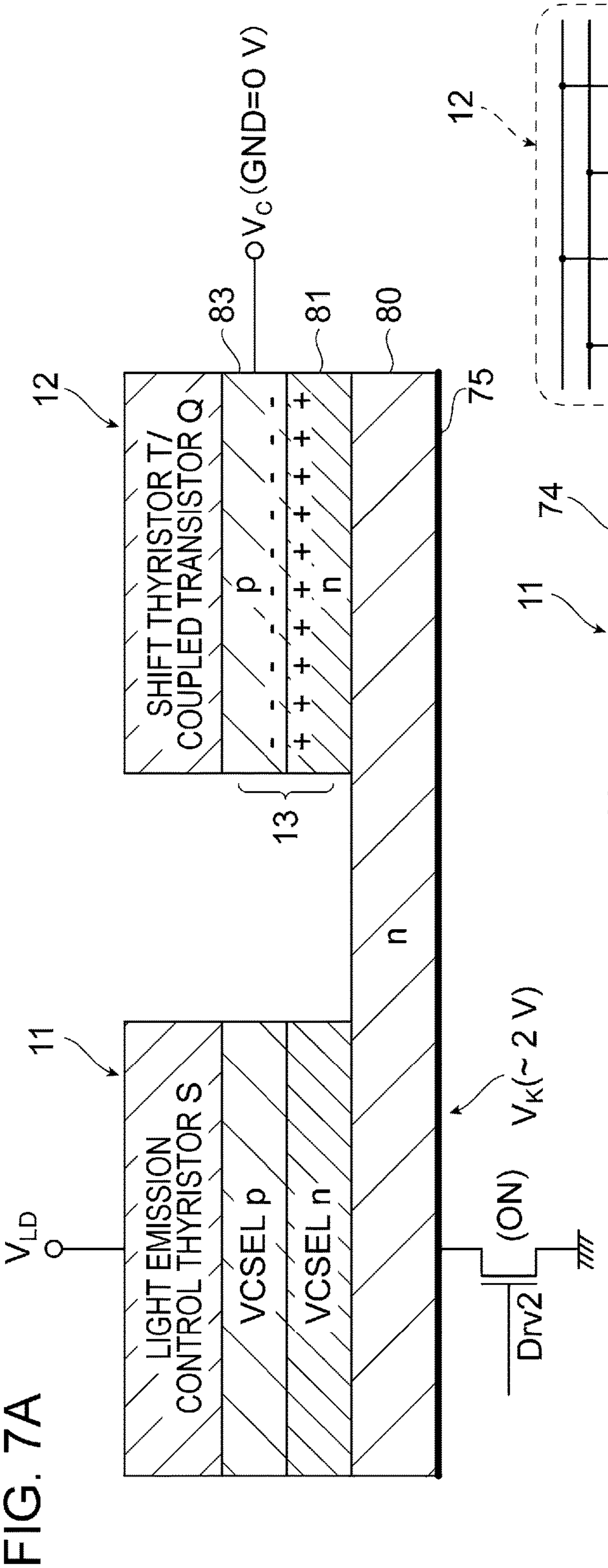
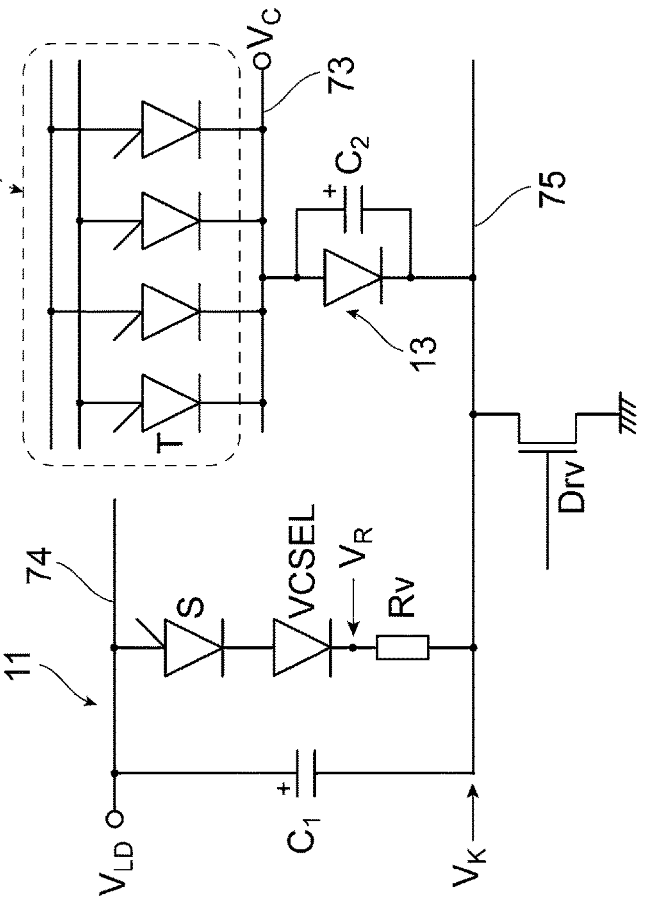
FIG. 7B

V_LD (7 V)
C_1 [100 pF] (500 pC)
V_K (2 V)
74
11
S
VCSEL
V_R (4 V)
Rv
13
73
V_C (0 V)
C_2 [200 pF] (400 pC)
75
(ON)
Drv2

V_LD (7V)
C_1 [100 pF] (500 pC⇒280 pC)
V_K (2 V⇒4.2 V)
V_R (4 V⇒4.2 V)
V_C (0 V⇒3.3 V)
C_2 [200 pF] (400 pC⇒180 pC)
(ON⇒OFF)

V_LD (7 V)
C_1 [100 pF] (280 pC)
V_K (4.2V)
V_R (4.2 V)
V_C (3.3 V)
C_2 [200 pF] (180 pC)
(OFF)

V_LD (7 V)
C_1 [100 pF] (280 pC⇒500 pC)
V_K (4.2 V⇒2 V)
V_R (4.2 V⇒4 V)
V_C (3.3 V⇒0 V)
C_2 [200 pF] (180 pC⇒400 pC)
(OFF⇒ON)

LIGHT EMITTING DEVICE AND MEASUREMENT APPARATUS

CROSS-REFERENCE TO RELATED APPLICATIONS

This application is based on and claims priority under 35 USC 119 from Japanese Patent Application No. 2022-045915 filed Mar. 22, 2022.

BACKGROUND

(i) Technical Field

The present disclosure relates to a light emitting device and a measurement apparatus.

(ii) Related Art

Japanese Unexamined Patent Application Publication No. 2019-57652 describes a light emitting component that includes a substrate, a plurality of light emitting elements provided on the substrate to output light in a direction that intersects a surface of the substrate, and a plurality of thyristors stacked on respective ones of the plurality of light emitting elements to drive the light emitting elements as to emit light or increase the amount of emitted light when the thyristors are brought into an on state, in which the thyristors have an opening portion in a path of light directed from the light emitting elements toward the thyristors.

SUMMARY

A light emitting device that generates light emission pulses rising and falling in the order of several hundreds of picoseconds with a light emission current in the order of amperes is requires for a measurement apparatus that measures the three-dimensional shape of an object to be measured using a Time of Flight (ToF) method. However, the waveform of the light emission pulses may be degraded by a capacitor (electric capacitor) that accompanies the light emitting device.

Aspects of non-limiting embodiments of the present disclosure relate to providing a light emitting device etc. in which the effect of a capacitor on the waveform of light emission pulses is suppressed.

Aspects of certain non-limiting embodiments of the present disclosure overcome the above disadvantages and/or other disadvantages not described above. However, aspects of the non-limiting embodiments are not required to overcome the disadvantages described above, and aspects of the non-limiting embodiments of the present disclosure may not overcome any of the disadvantages described above.

According to an aspect of the present disclosure, there is provided a light emitting device including: a light emitting section that includes a light emitting element; a capacitor section connected to the light emitting section; and a control section that controls a potential of the capacitor section when the light emitting element of the light emitting section emits light.

BRIEF DESCRIPTION OF THE DRAWINGS

Exemplary embodiments of the present disclosure will be described in detail based on the following figures, wherein:

FIGS. 4A and 4B illustrate operation of a light source with a shift thyristor, a coupled transistor, a light emission control thyristor, and a vertical cavity surface emitting laser (VCSEL), in which FIG. 4A illustrates an equivalent circuit and FIG. 4B is a sectional view of a portion with the shift thyristor and the coupled transistor;

FIGS. 5A and 5B illustrate the layout and a sectional surface of the light source, in which FIG. 5A illustrates the layout and FIG. 5B illustrates a sectional surface taken along the line VB-VB in FIG. 5A;

FIGS. 6A to 6C illustrate the waveform of light emission pulses from a VCSEL in a light emitting device, in which FIGS. 6A and 6B illustrate the waveform of light emission pulses from a VCSEL in a light emitting device including a shift section and FIG. 6C illustrates the waveform of light emission pulses from a VCSEL in a light emitting device not including a shift section;

FIG. 7A is an enlarged sectional view of the light source, and FIG. 7B illustrates a circuit that is equivalent to a portion indicated in the enlarged sectional view;

FIGS. 8A to 8D illustrate an effect of a capacitor section on the waveform of light emission pulses in the light emitting device, in which FIG. 8A illustrates a case where a driver is turned on, FIG. 8B illustrates a case where the driver is switched from on to off, FIG. 8C illustrates a case where the driver is turned off, and FIG. 8D illustrates a case where the driver is switched from off to on;

FIGS. 9A to 9D illustrate operation of the light emitting device according to the first exemplary embodiment, in which FIG. 9A illustrates a case where a driver is turned on, FIG. 9B illustrates a case where the driver is switched from on to off, FIG. 9C illustrates a case where the driver is turned off, and FIG. 9D illustrates a case where the driver is switched from off to on;

FIGS. 10A and 10B illustrate a generalized form of control for rendering the potential of a control potential different, in which FIG. 10A illustrates a case where the driver is turned on and FIG. 10B illustrates the case where the driver is switched from on to off;

FIGS. 16A to 16D illustrate operation of the light emitting device according to the second exemplary embodiment, in which FIG. 16A illustrates a case where a driver is turned on, FIG. 16B illustrates a case where the driver is switched from on to off, FIG. 16C illustrates a case where the driver is turned off, and FIG. 16D illustrates a case where the driver is switched from off to on;

FIGS. 17A and 17B illustrate the waveform of light emission pulses from a VCSEL in a light emitting device, in which FIG. 17A illustrates a case where the control potential is maintained at a ground potential when the driver is turned off and FIG. 17B illustrates a case where the control potential is set to a floating potential when the driver is turned off.

DETAILED DESCRIPTION

Exemplary embodiments of the present disclosure will be described in detail below with reference to the accompanying drawings.

A measurement apparatus that measures the three-dimensional shape of an object to be measured on the basis of a Time of Flight (ToF) method measures the three-dimensional shape of the object to be measured using the time of flight of light. That is, in the ToF method, the distance from a light emitting device to the object to be measured is measured from the time of flight of light as the time since the timing when light is output from the light emitting device until the timing when the light is received by a three-dimensional (3D) sensor after being reflected by the object to be measured. In order to precisely measure the three-dimensional shape of the object to be measured, light pulses rising and falling in the time of several hundreds of picoseconds with a light emission current of several amperes are required.

First Exemplary Embodiment

Measurement Apparatus 100

Figure 1:
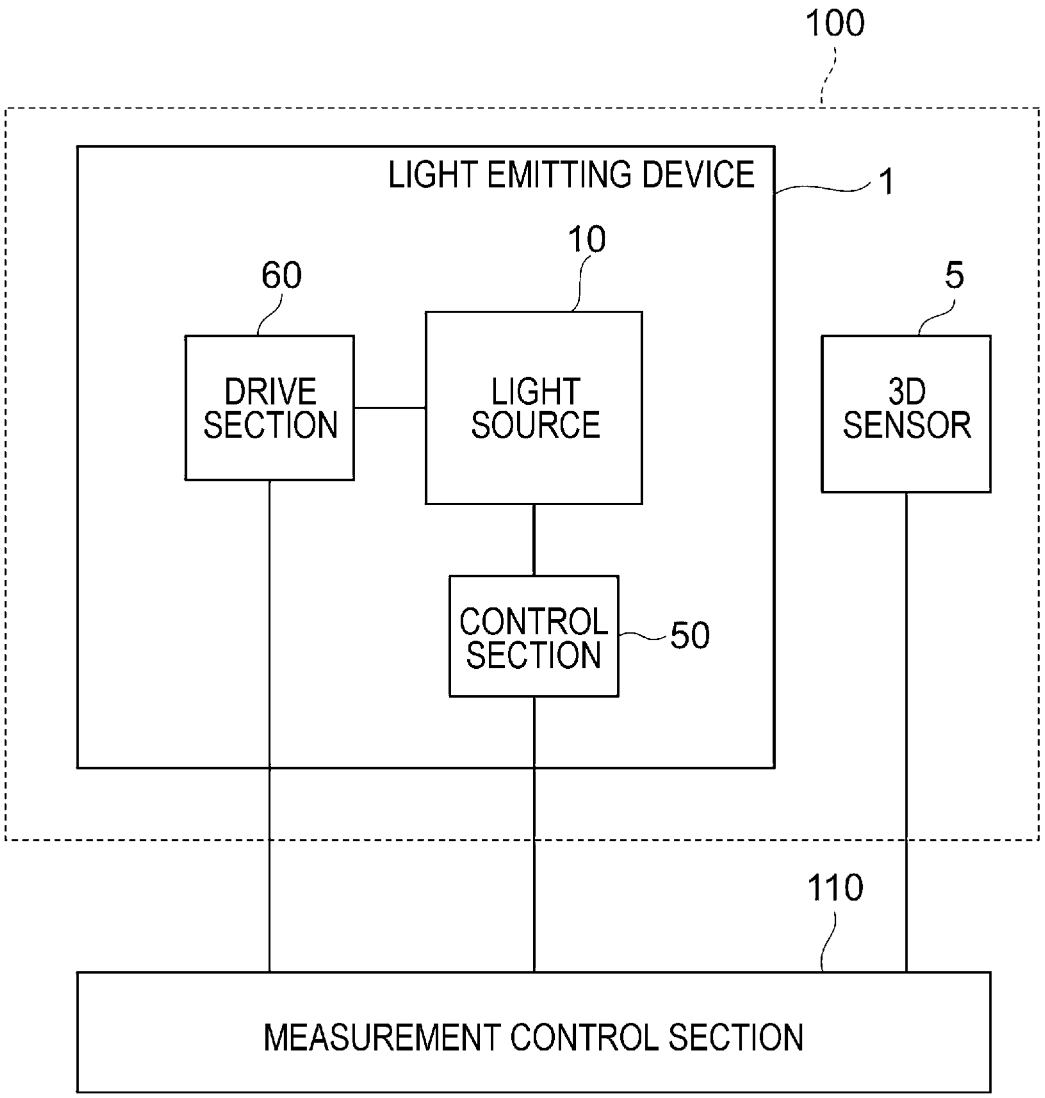
FIG. 1 is a block diagram illustrating the configuration of a measurement apparatus.

FIG. 1 is a block diagram illustrating the configuration of a measurement apparatus 100. The measurement apparatus 100 includes a light emitting device 1 and a three-dimensional sensor 5 (hereinafter referred to as "3D sensor 5"). The light emitting device 1 includes a light source 10, a control section 50, and a drive section 60. FIG. 1 illustrates a measurement control section 110 in addition to the measurement apparatus 100.

The light source 10 in the light emitting device 1 outputs light toward an object to be measured. The 3D sensor 5 acquires light (reflected light) reflected by and returned from the object to be measured. Then, the 3D sensor 5 outputs information (distance information) about the distance to the object to be measured, the distance information being based on the time since the output of the light until the reception of the reflected light. The 3D sensor 5 is an example of a light receiving section.

The measurement control section 110 is constituted as a computer that includes a central processing unit (CPU), a read only memory (ROM), a random access memory (RAM), etc., and specifies the three-dimensional shape (hereinafter referred to as "3D shape") of the object to be measured on the basis of the distance information acquired from the 3D sensor 5. Specifying the 3D shape of the object to be measured is occasionally referred to as three-dimensional measurement, 3D measurement, or 3D sensing. The measurement apparatus 100 may include the measurement control section 110.

Such a measurement apparatus is applied to recognize the object to be measured from the specified 3D shape. For example, the measurement apparatus is mounted on a portable information processing device etc., and used to recognize the face of a user that attempts access. That is, the 3D shape of the face of a user that attempts access is specified to recognize whether or not such access is allowed, and the use of the device (portable information processing device) is allowed only in the case where it is recognized that access by the user is allowed.

The measurement apparatus is also applied in the case where the 3D shape of the object to be measured is continuously measured for augmented reality (AR) etc.

Such a measurement apparatus may be applied to information processing devices such as personal computers (PCs), besides the portable information processing devices.

Divided Irradiation

Figure 2:
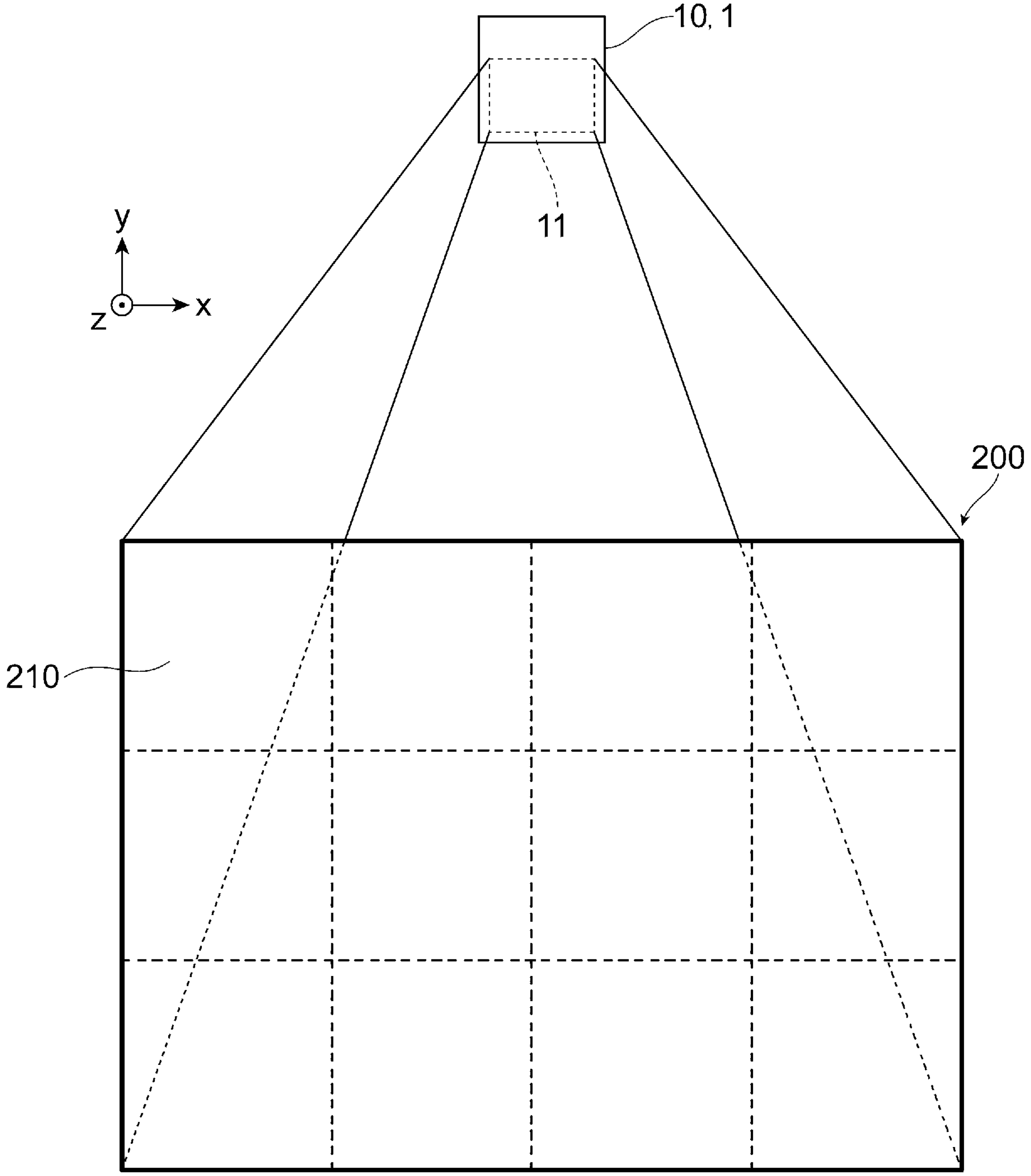
FIG. 2 is a perspective view illustrating an irradiated region irradiated with light from a light emitting device.

FIG. 2 is a perspective view illustrating an irradiated region 200 irradiated with light from the light emitting device 1. The irradiated region 200 is a range to be irradiated with light output from the light emitting device 1 in order to measure the 3D shape of the object to be measured. The 3D shape of the object to be measured is measured in the case where the object to be measured is present in the irradiated region 200.

The irradiated region 200 is divided into a plurality of irradiated areas 210. In the light emitting device 1, a light emitting section 11 to be discussed later includes a plurality of light emitting elements so that the irradiated areas 210 are irradiated with light from the corresponding light emitting elements. When each irradiated area 210 is irradiated with light from the light emitting device 1, such irradiation is referred to as "divided irradiation". While the irradiated areas 210 are arranged in a two dimensional array of 4×3 in FIG. 2, the arrangement of the irradiated areas 210 may be different from 4×3. In the case of the divided irradiation, light emitting elements corresponding to the irradiated areas 210 may be selected so that the selected light emitting elements are caused to emit light while unselected light emitting elements are not caused to emit light. In the following description, the light emitting device 1 is caused to perform divided irradiation, and the selected light emitting elements are caused to emit light. However, the irradiated region 200 may be irradiated collectively. When the irradiated region 200 is irradiated collectively, such irradiation is referred to as "collective irradiation".

Light Emitting Device 1

Figure 3:
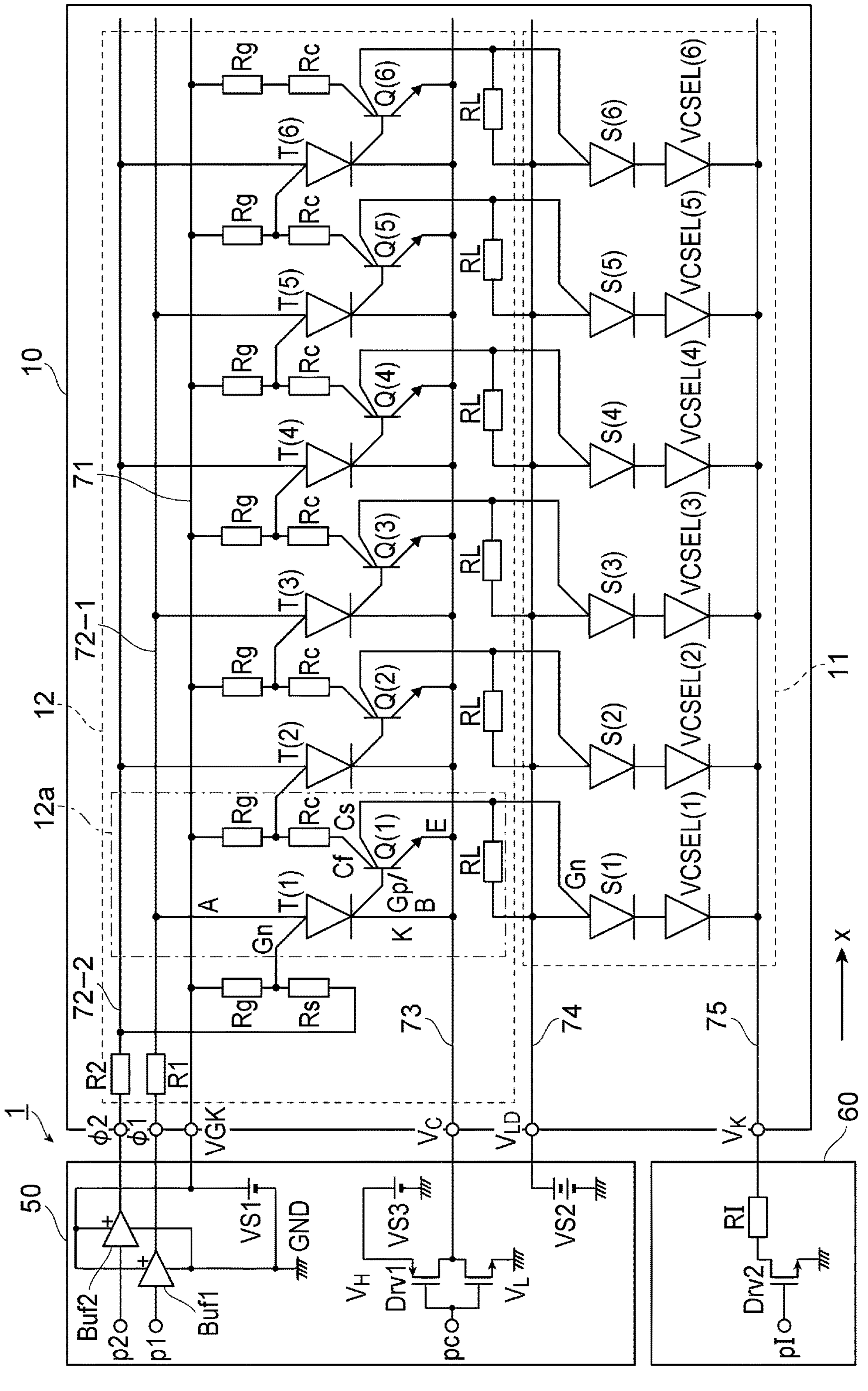
FIG. 3 illustrates a circuit that is equivalent to a light emitting device according to a first exemplary embodiment.

FIG. 3 illustrates a circuit that is equivalent to the light emitting device 1 according to the first exemplary embodiment. In FIG. 3, the rightward direction on the sheet surface is defined as "+x direction". Thyristors and transistors are indicated by symbols, and resistors are indicated by rectangles. The same applies to the other drawings. As discussed earlier, the light emitting device 1 includes the light source 10, the control section 50, and the drive section 60.

Light Source 10

The light source 10 includes a ϕ1 terminal, a ϕ2 terminal, a VGK terminal, a $V_C$ terminal, a $V_{LD}$ terminal, and a $V_K$ terminal on one side (−x direction side). VGK is a potential (power source potential VGK) that drives a shift section 12 in the light source 10, $V_C$ is a potential (control potential $V_C$) that controls the potential of a capacitor section 13 of the light source 10, $V_{LD}$ is a potential (light emitting potential $V_{LD}$) that supplies a light emission current to the light emitting elements of the light emitting section 11 in the light source 10, and $V_K$ is a potential (substrate potential $V_K$) of a substrate (n-type semiconductor substrate 80) that constitutes the light source 10.

The light source 10 includes the light emitting section 11, the shift section 12, and the capacitor section 13. The capacitor section 13 will be described with reference to FIGS. 7A and 7B.

The light emitting section 11 includes a plurality of vertical cavity surface emitting lasers VCSEL and light emission control thyristors S. In the following description, the vertical cavity surface emitting lasers VCSEL will be referred to as "VCSELs". In FIG. 3, six VCSELs (VCSEL (1) to VCSEL(6)) and six light emission control thyristors S (light emission control thyristors S(1) to S(6)) are illustrated. The anode of the VCSELs and the cathode of the light emission control thyristors S are connected to each other. That is, the VCSEL and the light emission control thyristor S of the same number are connected in series with each other. The six VCSELs and the six light emission control thyristors S are arranged from one side (−x direction side) toward the other side (+x direction side). The VCSELs are an example of the light emitting elements. The light emitting elements may be thyristors such as the light emission control thyristors S, and a pn junction in the thyristors may emit light.

The shift section 12 includes a plurality of shift thyristors T, coupled transistors Q, power source line resistors Rg, current limiting resistors RL, and coupled resistors Rc. In FIG. 3, six shift thyristors (shift thyristor T(1) to T(6)) and six coupled transistors Q (coupled transistors Q(1) to Q(6)) are illustrated. In FIG. 3, six power source line resistors Rg, six current limiting resistors RL, and six coupled resistors Rc are illustrated, which are not numbered. One shift thyristor T, one coupled transistor Q, one power source line resistor Rg, one current limiting resistor RL, and one coupled resistor Rc constitute a shift unit 12*a*. Six shift units 12*a* are arranged from one side (−x direction side) toward the other side (+x direction side). The shift section 12 includes a power source line resistor Rg and a start resistor Rs at an end portion on one side (−x direction side). The light source 10 further includes current limiting resistors R1, R2.

In the shift unit 12*a*, the shift thyristor T and the coupled transistor Q are connected to each other. The coupled transistor Q in the shift unit 12*a* is connected to a light emission control thyristor S of the light emitting section 11. That is, the shift thyristors T(1) to T(6) are connected to the coupled transistors Q(1) to Q(6) of the same number, and the coupled transistors Q(1) to Q(6) are connected to the light emission control thyristors S(1) to S(6) of the same number. While the number of the shift thyristors T, the coupled transistors Q, the light emission control thyristors S, and the VCSELs is six each, there may be a different number of them.

Figures 5A, 5B:
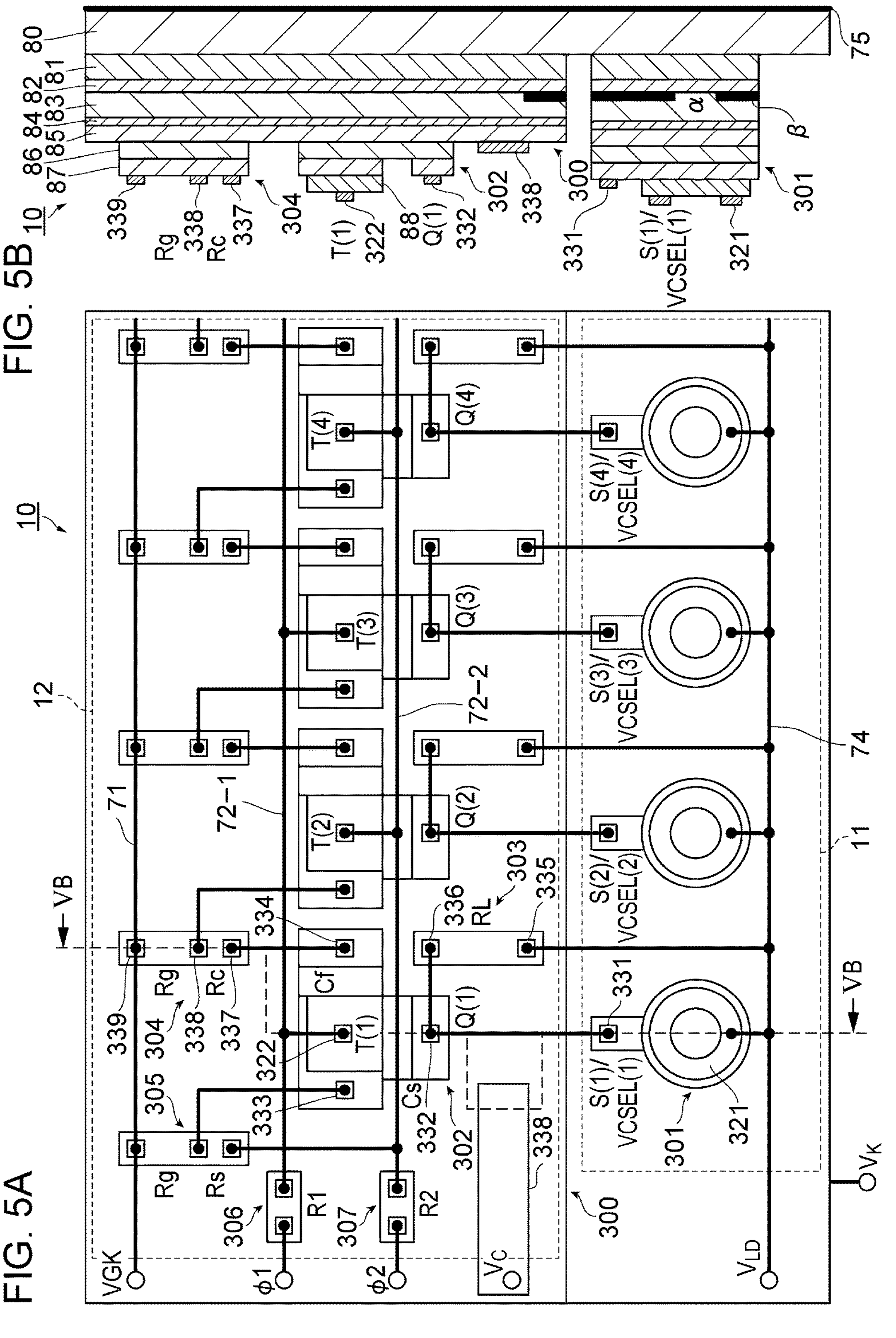

In the light source 10, the VGK terminal is connected to a power source line 71, the ϕ1 terminal is connected to a shift signal line 72-1, the ϕ2 terminal is connected to a shift signal line 72-2, the $V_C$ terminal is connected to a control potential layer 73, the $V_{LD}$ terminal is connected to a light emitting potential line 74, and the $V_K$ terminal is connected to a substrate electrode 75. While the control potential layer 73 is illustrated in the form of a line in FIG. 3, the control potential layer 73 is a p-type semiconductor layer 83 as illustrated in FIG. 7A to be discussed later. Hence, the term "control potential layer 73" is used. Similarly, while the substrate electrode 75 is illustrated in the form of a line in FIG. 3, the substrate electrode 75 is an electrode (back surface electrode) provided on the back surface of an n-type semiconductor substrate 80 that constitutes the light source 10 as illustrated in FIG. 5B to be discussed later. Hence, the term "substrate electrode 75" is used. The shift signal lines 72-1, 72-2 are referred to as "shift signal lines 72" in the case where the shift signal lines are not differentiated from each other.

The capacitor section 13 is an electrical capacitor (hereinafter referred to as "capacitor") constituted between the $V_C$ terminal and the $V_K$ terminal.

Control Section 50

The control section 50 generates shift signals p1, p2 and a control signal pc, and controls the light source 10.

The control section 50 includes buffers Buf1, Buf2, power sources VS1, VS2, VS3, and a driver Drv1. The buffer Buf1 supplies the shift signal p1 to the ϕ1 terminal of the light source 10. The buffer Buf2 supplies the shift signal p2 to the ϕ2 terminal of the light source 10. The driver Drv1 supplies the control potential $V_C$ to the $V_C$ terminal of the light source 10.

The power source VS1 generates the power source potential VGK, and supplies the power source potential VGK to the VGK terminal of the light source 10. The power source VS1 also serves as a power source for the buffers Buf1, Buf2. That is, the buffers Buf1, Buf2 outputs a potential that is substantially the voltage of the power source VS1 when the shift signals p1, p2 are at an H level (occasionally indicated as "H"), and outputs a potential that is substantially a ground potential (ground potential GND (0 V)) when the shift signals p1, p2 are at an L level (occasionally indicated as "L"). The power source for the buffers Buf1, Buf2 may be a power source that is independent of the power source potential VGK. In the following, supplying the ground potential GND will be expressed as being "grounded", and the ground will be denoted as "GND".

The power source VS2 generates the light emitting potential $V_{LD}$, and supplies the light emitting potential $V_{LD}$ to the $V_{LD}$ terminal of the light source 10.

The driver Drv1 includes a driver element of a complementary type (complementary metal oxide semiconductor (CMOS) configuration) in which an n-channel metal oxide semiconductor (NMOS) transistor and a p-channel metal oxide semiconductor (PMOS) transistor are combined with each other, for example. The source of the NMOS transistor is grounded, and the source of the PMOS transistor is connected to the power source VS3. The drain of the NMOS transistor and the drain of the PMOS transistor are connected to each other, and connected to the $V_C$ terminal. The gate of the NMOS transistor and the gate of the PMOS transistor are connected to each other, and receive the control signal pc supplied thereto. The control potential $V_C$ to be supplied to the $V_C$ terminal is brought to a potential $V_L$ when the control signal pc is at an H level, and the control potential $V_C$ to be supplied to the $V_C$ terminal is brought to a potential $V_H$ when the control signal pc is at an L level. The potential $V_H$ is a potential supplied by the power source VS3. By way of example, $V_L$ is the ground potential GND (0 V), and $V_H$ is 3.3 V as discussed later. The potential $V_L$ is an example of a first potential, and the potential $V_H$ is an example of a second potential. While the driver Drv1 includes a driver element of a CMOS configuration, the driver Drv1 may include a different driver element or switch.

While the control section 50 generates shift signals p1, p2 and a control signal pc, the control section 50 may receive such signals from the measurement control section 110. The control section 50 and the measurement control section 110 may be used together as a control section.

Drive Section 60

The drive section 60 generates a light emission signal pI, and causes the VCSELs of the light source 10 to emit light.

The drive section 60 includes a driver Drv2 and a light emission current limiting resistor RI. The driver Drv2 includes an NMOS transistor as a driver element, for example. The source of the NMOS transistor is grounded, and the drain of the NMOS transistor is connected to the $V_K$ terminal via the light emission current limiting resistor RI. The NMOS transistor is set to on or off in accordance with the light emission signal pI applied to the gate thereof. When the light emission signal pI is at an H level, the driver Drv2 is turned on, the drain of the NMOS transistor is brought to the ground potential GND (0 V), and the $V_K$ terminal of the light source 10 is varied toward the ground potential GND (0 V). When the light emission signal pI is at an L level, the driver Drv2 is turned off. A different element such as an insulated gate bipolar transistor (IGBT) may be used in place of the NMOS transistor. While the drive section 60 generates the light emission signal pI, the light emission signal pI may be received from the measurement control section 110. The drive section 60 and the measurement control section 110 may be used together as a drive section.

The relationship of connection in the light source 10 is described with reference to an enlarged diagram. The light emission control thyristor S is occasionally referred to as "light emission control thyristor", the shift thyristor T is occasionally referred to as "shift thyristor", and the coupled transistor Q is occasionally referred to as "coupled transistor". The light emission control thyristor S and the shift thyristor T are occasionally referred to as "thyristors", rather than being differentiated from each other.

Operation of Shift Thyristors, Coupled Transistors, VCSELs, and Light Emission Control Thyristors Basic operation of the light source 10 is described.

The shift thyristors and the light emission control thyristors are thyristors of an npnp structure. The thyristors each include an n-type cathode K (hereafter referred to as "cathode K"; the same applies hereinafter), a p-type gate Gp (p gate Gp), an n-type gate Gn (n gate Gn), and a p-type anode A (anode A). The p gate Gp of the light emission control thyristors S is not used for control, and therefore is not illustrated.

The coupled transistors are each a multicollector npn bipolar transistor. The coupled transistors each include an n-type emitter E (emitter E), a p-type base B (base B), and n-type collectors Cf, Cs (collectors Cf, Cs).

The above symbols are used without differentiation among the thyristors and coupled transistors. The same applies to bipolar transistors that constitute the thyristors to be discussed later. The thyristors are each constituted of a combination of an npn bipolar transistor and a pnp bipolar transistor with a single collector. Hence, the terms "emitter E", "base B", and "collector C" are used. In the following, the terms "anode A", "cathode K", "n gate Gn", "p gate Gp", "emitter E", "base B", and "collector C" will be used even in the case where such symbols are not used in the drawings.

The shift thyristors T, the coupled transistors Q, the light emission control thyristors S, and the VCSELs are constituted from a III-V compound semiconductor such as GaAs, for example. A forward voltage (diffusion potential) Vd of the junction of the compound semiconductor is defined as 1.5 V, and a saturation voltage Vsat of bipolar transistors constituted of the compound semiconductor is defined as 0.3 V. The ground potential GND is defined as 0 V, the power source potential VGK is defined as 5 V, and the light emitting potential $V_{LD}$ is defined as 7 V. The shift signals p1, p2, the control signal pc, and the light emission signal pI are each a signal with an L level at 0 V ("L" (0 V)) and with an H level at 5 V ("H" (5 V)).

Figure 4A:
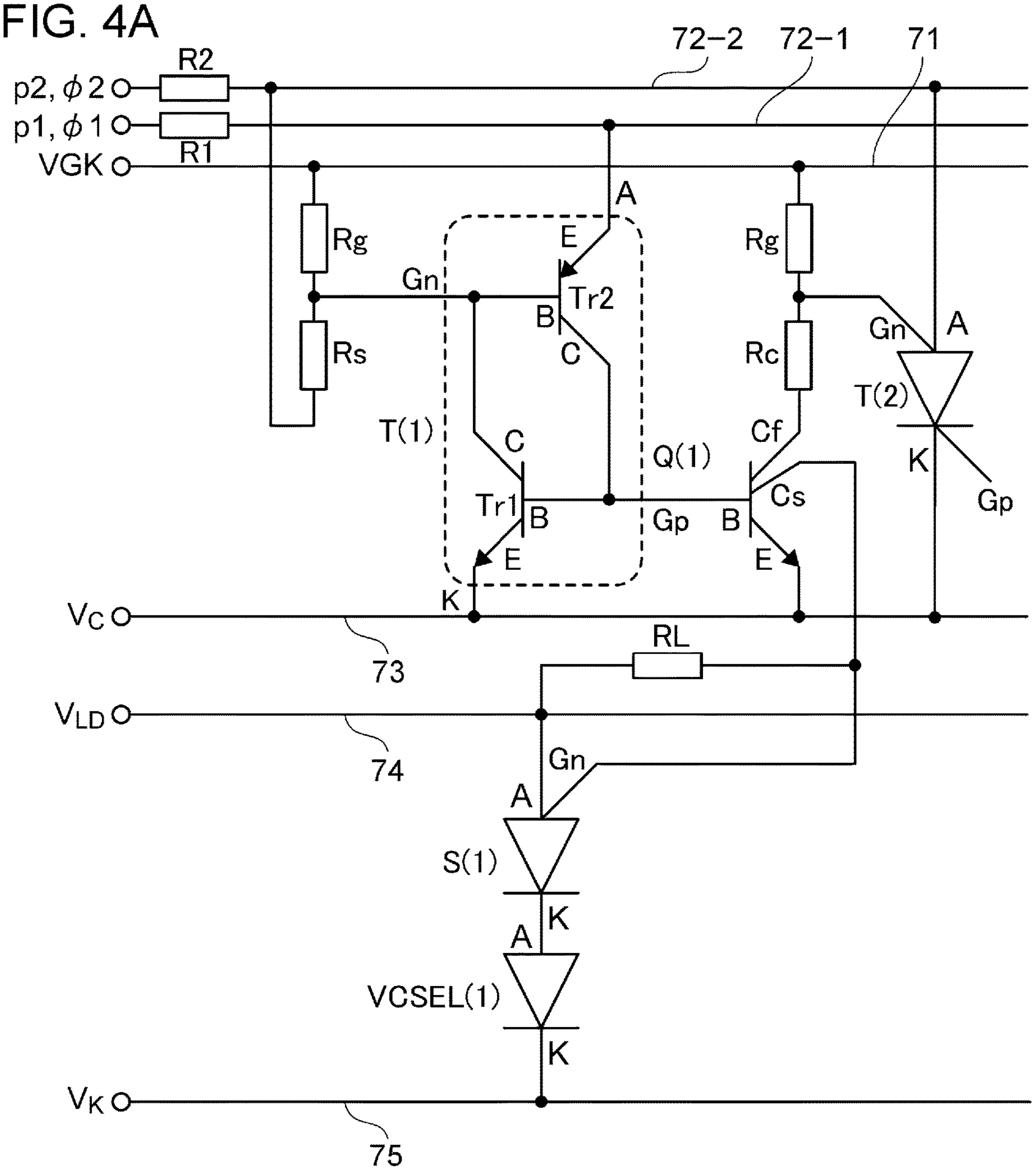
Figure 4B:
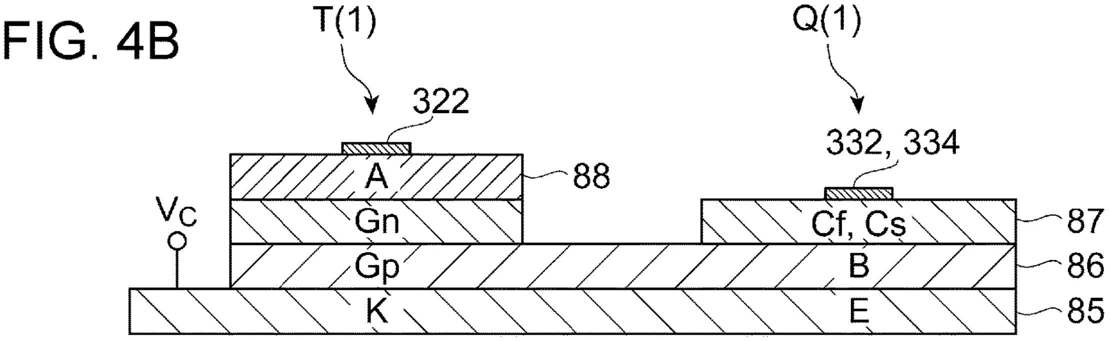

FIGS. 4A and 4B illustrate operation of the light source 10 with the shift thyristor T(1), the coupled transistor Q(1), the light emission control thyristor S(1), and the VCSEL(1). FIG. 4A illustrates an equivalent circuit, and FIG. 4B is a sectional view of a portion with the shift thyristor T(1) and the coupled transistor Q(1). The shift thyristor T(2) is also illustrated in FIG. 4A.

As illustrated in FIG. 4A, the shift thyristor T(1) is constituted of a combination of an npn bipolar transistor Tr1 (hereinafter referred to as "npn transistor Tr1") and a pnp bipolar transistor Tr2 (hereinafter referred to as "pnp transistor Tr2"). The base B of the npn transistor Tr1 is connected to the collector C of the pnp transistor Tr2, and the collector C of the npn transistor Tr1 is connected to the base B of the pnp transistor Tr2. The emitter E of the npn transistor Tr1 is the cathode K of the shift thyristor T(1), and the emitter E of the pnp transistor Tr2 is the anode A of the shift thyristor T(1). The collector C of the npn transistor Tr1 (the base B of the pnp transistor Tr2) is the n gate Gn of the shift thyristor T(1), and the collector C of the pnp transistor Tr2 (the base B of the npn transistor Tr1) is the p gate Gp of the shift thyristor T(1).

The cathode K of the shift thyristor T(1) (the emitter E of the npn transistor Tr1) is connected to the control potential layer 73. The control potential layer 73 is connected to the $V_C$ terminal, to which the control potential $V_C$ is supplied. The anode A of the shift thyristor T(1) (the emitter E of the pnp transistor Tr2) is connected to the shift signal line 72-1. The shift signal line 72-1 is connected to the ϕ1 terminal, to which the shift signal p1 is supplied. The n gate Gn of the shift thyristor T(1) is connected to a connection point between the start resistor Rs and the power source line resistor Rg, which are connected in series with each other. The other side (that is not the connection point) of the start resistor Rs is connected to the shift signal line 72-2. The shift signal line 72-2 is connected to the ϕ2 terminal, to which the shift signal p2 is supplied. The other side (that is not the connection point) of the power source line resistor Rg is connected to the power source line 71. The power source line 71 is connected to the VGK terminal, to which the power source potential VGK is supplied.

The coupled transistor Q(1) is an npn transistor. The base B of the coupled transistor Q(1) is connected to the p gate Gp of the shift thyristor T(1) (the base B of the npn transistor Tr1 and the collector C of the pnp transistor Tr2). The emitter E of the coupled transistor Q(1) is connected to the control potential layer 73. The collector Cf of the coupled transistor Q(1) is connected to the power source line 71 via the coupled resistor Rc and the power source line resistor Rg, which are connected in series with each other. The connection point between the coupled resistor Rc and the power source line resistor Rg is connected to the n gate Gn of the shift thyristor T(2).

The npn transistor Tr1 in the shift thyristor T(1) and the coupled transistor Q(1) constitute a current mirror circuit. That is, a current that is proportional to a current that flows through the npn transistor Tr1 flows through the coupled transistor Q(1).

The collector Cs of the coupled transistor Q(1) is connected to the n gate Gn of the light emission control thyristor S(1), and connected to the light emission potential line 74 via the current limiting resistor RL. The light emission potential line 74 is connected to the $V_{LD}$ terminal, to which the light emitting potential $V_{LD}$ is supplied.

As discussed earlier, the VCSEL(1) and the light emission control thyristor S(1) are connected in series with each other. That is, the anode A of the VCSEL(1) and the cathode K of the light emission control thyristor S(1) are connected to each other. The anode A of the light emission control thyristor S(1) is connected to the light emission potential line 74. The cathode K of the VCSEL(1) is connected to the substrate electrode 75. The substrate electrode 75 is connected to the $V_K$ terminal, which is connected to the driver Drv2 via the light emission current limiting resistor RI (see FIG. 3).

The anode A of the shift thyristor T(2) is connected to the shift signal line 72-2. The shift signal line 72-2 is connected to the ϕ2 terminal, to which the shift signal p2 is supplied. As illustrated in FIG. 3, the anodes A of odd-numbered shift thyristors T are connected to the shift signal line 72-1, and the anodes A of even-numbered shift thyristors T are connected to the shift signal line 72-2. The relationship of connection among the shift thyristor T, the coupled transistor Q, the light emission control thyristor S, and the VCSEL with a number of 2 or more is the same as that among the shift thyristor T(1), the coupled transistor Q(1), the light emission control thyristor S(1), and the VCSEL(1), except for the relation of connection of the shift thyristor T with the shift signal lines 72-1, 72-2. In the following, the terms "shift signal p1 (ϕ1)" and "shift signal p2 (ϕ2)" will be occasionally used.

First, operation of the shift thyristor T(1) in the shift section 12 is described.

It is assumed that the power source line 71 is at the power source potential VGK (5 V), the control potential layer 73 is at the ground potential GND (0 V) with the control signal pc at "L" (0V), the shift signal lines 72-1, 72-2 are at the ground potential GND (0 V) with the shift signals p1 (ϕ1), p2 (ϕ2) at "L" (0 V), the driver Drv2 is turned off with the light emission signal pI at "L" (0 V), and the substrate electrode 75 is not supplied with a voltage. This state is referred to as "initial state".

At this time, the npn transistor Tr1 and the pnp transistor Tr2, which constitute the shift thyristor T(1), are in the off state. The n gate Gn of the shift thyristor T(1) is connected to a connection point between the start resistor Rs and the power source line resistor Rg, which are connected in series with each other. The other side (that is not the connection point) of the start resistor Rs is connected to the shift signal line 72-2 which is at "L" (0 V), and the other side (that is not the connection point) of the power source line resistor Rg is connected to the power source line 72 which is at 5 V. Hence, the n gate Gn is at a voltage obtained by dividing the voltage difference (5 V) between the start resistor Rs and the power source line resistor Rg. When the resistance ratio between the start resistor Rs and the power source line resistor Rg is defined as 1:5, by way of example, the n gate Gn is at 0.83 V.

When the shift signal p1 (ϕ1) is switched from "L" (0 V) to "H" (5 V), the voltage difference between the emitter E (anode A) ("H" (5 V)) of the pnp transistor Tr2 of the shift thyristor T(1) and the base B (p gate Gp) (0.83 V) is brought to 4.17 V, which is the forward voltage Vd (1.5 V) or more. Consequently, a forward bias is applied between the emitter E and the base B, which switches the pnp transistor Tr2 from the off state to the on state. Then, the collector C of the pnp transistor Tr2 (the base B of the npn transistor Tr1) is brought to 4.7 V, which is obtained by subtracting the saturation voltage Vsat (0.3 V) from the emitter E ("H" (5 V)) and which is the forward voltage Vd (1.5 V) or more. Consequently, a forward bias is applied between the emitter E and the base B, which switches the npn transistor Tr1 from the off state to the on state. Since the npn transistor Tr1 and the pnp transistor Tr2 in the shift thyristor T(1) are brought into the on state, the shift thyristor T(1) is switched from the off state to the on state. When the shift thyristor T is switched from the off state to the on state, the shift thyristor T is expressed as being "turned on". When the shift thyristor T is switched from the on state to the off state, the shift thyristor T is expressed as being "turned off".

That is, when the shift signal p1 (ϕ1) is switched from "L" (0 V) to "H" (5 V) in the initial state, the shift thyristor T(1) is turned on and switched from the off state to the on state. A state in which the shift thyristor T(1) may be turned on when the anode A is brought to "H" (5 V) is expressed as a "state in which the shift thyristor T(1) is switchable to the on state". Similar expressions are used for other cases.

When the shift thyristor T(1) is turned on, the n gate Gn in the shift thyristor T(1) is brought to the saturation voltage Vsat, which is 0.3 V. In addition, the anode A is brought to a voltage determined in accordance with a voltage (Vd+Vsat) obtained by adding the forward voltage Vd and the saturation voltage Vsat and a voltage reduction due to the internal resistance of the shift thyristor T. It is assumed that the anode A is brought to 1.9 V. That is, when the shift thyristor T(1) is turned on, the shift signal line 72-1 is switched from 5 V to 1.9 V. Then, the p gate Gp of the shift thyristor T(1) is brought to 1.6 V.

Ad described above, the shift thyristor T(1) is turned on when the potential of the n gate Gn is a potential that is the forward voltage Vd (1.5 V) or more lower than the potential of the anode A. The shift thyristor T(1) is turned off when the potential of the shift signal line 72-1 (the potential difference between the anode A and the cathode K) is less than 1.9 V. For example, when the anode A is brought to "L" (0 V), the potential difference between the anode A and the cathode K is brought to 0 V, and thus the shift thyristor T(0) is turned off. When the potential of the shift signal line 72-1 (the potential difference between the anode A and the cathode K) is 1.9 V or more, on the other hand, the shift thyristor T(1) is held in the on state. Hence, a voltage of 1.9 V is referred to as "holding voltage". The shift thyristor T(1) is not held in the on state when a current that holds the shift thyristor T(1) in the on state is not flowing, even if the holding voltage is applied. A current that holds the shift thyristor T(1) in the on state is expressed as a "holding current".

Next, operation of the coupled transistor Q(1) will be described.

When the shift thyristor T(1) is in the off state, the npn transistor Tr1 is in the off state. Hence, the coupled transistor Q(1) is also in the off state. At this time, the emitter E in the coupled transistor Q(1) is connected to the control potential layer 73, which is at the ground potential GND (0 V). The collector Cf is at the power source potential VGK (5 V) via the power source line resistor Rg and the coupled resistor Rc, which are connected in series with each other. The collector Cs is at the light emitting potential $V_{LD}$ (7 V) via the current limiting resistor RL.

As discussed earlier, when the shift thyristor T(1) is turned on, the shift signal line 72-1 is brought to 1.9 V. Then, the p gate Gp of the shift thyristor T(1) is brought to 1.6 V. Since the base B of the coupled transistor Q(1) is connected to the p gate Gp of the shift thyristor T(1), the forward voltage Vd (1.5 V) or more, that is, a forward bias, is applied between the emitter E and the base B of the coupled transistor Q(1). Consequently, the coupled transistor Q(1) is switched from the off state to the on state. Then, the collector Cf is brought to the saturation voltage Vsat (0.3 V) (the collector Cs will be discussed later). The connection point (the n gate Gn of the shift thyristor T(2)) between the power source line resistor Rg and the coupled resistor Rc is at a voltage obtained by dividing the voltage difference (4.7 V) between the voltage (5 V) of the power source line 71 and the voltage (0.3 V) of the collector Cf between the power source line resistor Rg and the coupled resistor Rc. When the resistance ratio between the power source line resistor Rg and the coupled resistor Rc is defined as 5:1, by way of example, the connection point (the n gate Gn of the shift thyristor T(2)) between the power source line resistor Rg and the coupled resistor Rc is at 1.08 V.

The anode A of the shift thyristor T(2) is connected to the shift signal line 72-2. The shift signal line 72-2 is connected to the ϕ2 terminal, to which the shift signal p2 (ϕ2) is supplied. Since the shift signal p2 (ϕ2) is at “L” (0 V), the shift thyristor T(2) is not turned on. When the shift signal p2 (ϕ2) is switched from “L” (0 V) to “H” (5 V), however, the anode A of the shift thyristor T(2) which is connected to the shift signal line 72-2 is brought to “H” (5 V). Then, the potential difference (3.92 V) between the anode A and the n gate Gn (1.08 V) of the shift thyristor T(2) is brought to the forward voltage Vd (1.5 V) or more. Then, the shift thyristor T(2) is turned on with a forward bias applied between the n gate Gn and the anode A. At this time, the shift thyristor T(1) and the shift thyristor T(2) are in the on state. Next, when the shift signal p1 (ϕ1) is switched from “H” (5 V) to “L” (0 V), the shift thyristor T(1) is turned off with the anode A of the shift thyristor T(1) brought to “L” (0 V).

That is, shift thyristors T to be brought into the on state are shifted with the shift signals p1 (ϕ1), p2 (ϕ2) alternately switched between “L” (0 V) and “H” (5 V) with a period in which both the shift signals p1 (ϕ1), p2 (ϕ2) are at “H” (5 V). When a plurality of elements are provided, operation in which elements to be turned on are consecutively switched among the plurality of elements is defined as “shift operation”. In the exemplary embodiments herein, elements to be turned on and turned off through the shift operation are defined as “shift elements”.

Lastly, operation of the light emission control thyristor S(1) and the VCSEL(1) will be described.

The collector Cs of the coupled transistor Q(1) is connected to the n gate Gn of the light emission control thyristor S(1). Hence, when the coupled transistor Q(1) is switched from the off state to the on state, the potential of the n gate Gn of the light emission control thyristor S(1), which is connected to the collector Cs of the coupled transistor Q(1), is brought to 0.3 V, as with the collector Cs. The anode A of the light emission control thyristor S(1) is connected to the light emission potential line 74. The light emission potential line 74 is connected to the $V_{LD}$ terminal, to which the light emitting potential $V_{LD}$ (7 V) is supplied. Hence, the difference between the anode A and the n gate Gn of the light emission control thyristor S(1) is brought to 6.7 V, and the pn junction between the anode A and the n gate Gn of the light emission control thyristor S(1) is in the forward direction. Then, the collector Cs of the coupled transistor Q(1) draws a current from the light emitting potential $V_{LD}$ (7 V) via the pn junction between the anode A and the n gate Gn of the light emission control thyristor S(1). Consequently, the collector Cs of the coupled transistor Q(1) is at approximately 5.5 V, which is obtained by subtracting the forward voltage Vd (1.5 V) from the light emitting potential $V_{LD}$ (7 V). The driver Drv2 is turned on, and the $V_K$ terminal is varied toward the ground potential GND (0 V). Then, the substrate electrode 75 and the cathode K of the VCSEL(1) are varied toward 0 V. Consequently, the light emission control thyristor S(1) is turned on, and a current flows through the light emission control thyristor S(1) and the VCSEL(1), which are connected in series with each other, so that the VCSEL(1) emits light.

That is, the state in which the coupled transistor Q(1) is brought into the on state and the n gate Gn of the light emission control thyristor S(1) is brought to 5.5 V is a state in which the VCSEL(1) emits light when the driver Drv2 is turned on. Hence, the state in which the coupled transistor Q(1) is turned on and a forward bias (5.5 V) is applied between the anode A and the n gate Gn of the light emission control thyristor S(1) is expressed as a “state in which the VCSEL(1) is able to emit light”. The light emission control thyristor S controls light emission from the VCSEL in accordance with the potential of the n gate Gn, and thus is referred to as “light emission control thyristor”.

When the driver Drv2 is turned from on to off, a light emission current that has been flowing through the light emission control thyristor S(1) and the VCSEL(1) does not flow any more, and light emission from the VCSEL(1) is stopped (light is extinguished).

At this time, the shift thyristor T(1) is brought from the on state to the off state, and the coupled transistor Q(1) is switched from the on state to the off state. That is, the collector Cs of the coupled transistor Q(1) may not be maintained at 5.5 V. The n gate Gn of the light emission control thyristor S(1) is connected to the light emission potential line 74 at the light emitting potential $V_{LD}$ (7 V) via the current limiting resistor RL. Hence, the potential of the n gate Gn of the light emission control thyristor S(1) is raised toward the light emitting potential $V_{LD}$ (7 V). At this time, a parasitic capacitor Cag (with a capacitance of Cag) between the anode and the n gate Gn of the light emission control thyristor S(1) is discharged with a time constant of RL×Cag via the current limiting resistor RL (with a resistance value of RL). On the other hand, charge stored in a parasitic capacitor Cgg between the n gate Gn and the p gate Gp, a parasitic capacitor Cgk between the p gate Gp and the cathode K, and a parasitic capacitor Cv of the VCSEL(1) in the light emission control thyristor S(1) are not movable, and thus the potential of the p gate Gp and the cathode K of the light emission control thyristor S(1) is raised by an amount corresponding to the rise in the potential of the n gate Gn.

When the light emission signal pI is brought from “L” (0 V) to “H” (5 V) and the driver Drv2 is turned on again, the substrate potential $V_K$ is abruptly varied toward the ground potential GND (0 V). That is, the substrate electrode 75, to which the cathode K of the VCSEL(1) is connected, is abruptly varied toward the ground potential GND (0 V). Therefore, a displacement current flows through the parasitic capacitors Cag, Cgg, Cgk, and the light emission control thyristor S(1) is turned on using the current as a threshold current so that the VCSEL(1) emits light. That is, once the VCSEL(1) is caused to emit light, the VCSEL(1) emits light again when the driver Drv2 is turned on again, even if the shift thyristor T(1) is not in the on state. Also thereafter, the VCSEL(1) is able to repeatedly emit light and extinguish light. That is, the VCSEL(1) is able to continuously generate a plurality of light emission pulses. When the potential of the cathode K of the light emission control thyristor S(1) is raised to a small degree and is close to the ground potential GND, the light emission control thyristor S(1) is not turned on, even if the driver Drv2 is turned on again. The light emission pulses may be referred to as "light pulses" or "pulsed light".

The state in which the shift thyristor T(1) is not in the on state includes a case where operation of the shift section 12 has been stopped, that is, the shift section 12 is turned off, in addition to a case where the shift thyristor T(1) has been switched to the off state. Examples of the state in which the shift section 12 is turned off include a state in which both the shift signals p1, p2 are brought to "L" (0 V). As described above, once the VCSEL is caused to emit light, the VCSEL is able to continuously generate a plurality of light emission pulses, even if the shift section 12 is turned off. Bringing the VCSEL into the state of being able to emit light again is expressed as "exhibiting a memory effect".

The control potential $V_C$ is supplied to the cathode K of the shift thyristor T and the emitter E of the coupled transistor Q. Hence, in the case where the shift section 12 is caused to operate, it is required that the control potential $V_C$ should be set to a potential determined in advance, which is the ground potential GND (0 V) herein. In the case where the shift section 12 is not caused to operate or in the case where the shift section 12 is turned off, however, the control potential $V_C$ may be set to a potential that is different from the ground potential GND (0 V).

The above description is rephrased. In the initial state, the power source line 71 is at the power source potential VGK (5 V), the control potential layer 73 is at the ground potential GND (0 V), the shift signal lines 72-1, 72-2 are at the ground potential GND (0 V) with the shift signals p1 (ϕ1), p2 (ϕ2) at "L" (0 V), the driver Drv2 is turned off with the light emission signal pI at "L" (0 V), and the substrate electrode 75 is not supplied with a voltage. In the initial state, the shift thyristor T(1) is switchable to the on state. When the shift signal p1 (ϕ1) (shift signal line 72-1) is switched from "L" (0 V) to "H" (5 V), the shift thyristor T(1) is turned on and switched from the off state to the on state. When the shift thyristor T(1) is turned on, the coupled transistor Q(1) is switched from the off state to the on state. Then, a forward bias is applied between the anode A and the n gate Gn of the light emission control thyristor S(1), and the VCSEL(1) is able to emit light. When the substrate potential $V_K$ is varied toward the ground potential GND (0 V), the light emission control thyristor S(1) is turned on so that the VCSEL(1) emits light.

When the coupled transistor Q(1) is brought into the on state, the shift thyristor T(2) is switchable to the on state. When the shift signal p2 (ϕ2) (shift signal line 72-2) is switched from "L" (0 V) to "H" (5 V), the shift thyristor T(2) is turned on. When the shift signal p1 (ϕ1) (shift signal line 72-1) is switched from "H" (5 V) to "L" (0 V), the shift thyristor T(1) is turned off with the cathode K and the anode A brought to "L" (0 V). The other shift thyristors T, coupled transistors Q, light emission control thyristors S, and VCSELs operate in the same manner. That is, the shift thyristor T in the on state is shifted in accordance with the shift signal p1 (ϕ1) and the shift signal p2 (ϕ2).

Once the VCSEL(1) is caused to emit light, a memory effect is exhibited, and the VCSEL is able to continuously generate a plurality of light emission pulses, even if the shift section 12 is turned off.

While the shift thyristor T(1), the coupled transistor Q(1), the light emission control thyristor S(1), and the VCSEL(1) have been described above, the shift thyristor T in the on state is shifted through operation of the shift section 12, and a VCSEL connected to the shift thyristor T in the on state and the coupled transistor Q is selected as the VCSEL to be caused to emit light. Then, the VCSEL to be caused to emit light is caused to emit light as discussed above. When the VCSEL selected by the shift section 12 is caused to emit light in this manner, irradiation is performed for each irradiated area 210 in the divided irradiation. The shift section 12 is an example of a select section.

As illustrated in FIG. 4B, the light source 10 is a semiconductor component constituted by stacking a plurality of semiconductor layers on each other (see FIGS. 5A and 5B to be discussed later). FIG. 4B illustrates a portion in which an n-type semiconductor layer 85, a p-type semiconductor layer 86, an n-type semiconductor layer 87, and a p-type semiconductor layer 88 that constitute the shift thyristor T(1) and the coupled transistor Q(1) are stacked on each other. The shift thyristor T(1) is constituted using the n-type semiconductor layer 85 as the cathode K, the p-type semiconductor layer 86 as the p gate Gp, the n-type semiconductor layer 87 as the n gate Gn, and the p-type semiconductor layer 88 as the anode A. On the other hand, the coupled transistor Q(1) is constituted using the n-type semiconductor layer 85 as the emitter E, the p-type semiconductor layer 86 as the base B, the n-type semiconductor layer 87 as the collectors Cf, Cs. The cathode K of the shift thyristor T(1) and the emitter E of the coupled transistor Q(1) are electrically connected to each other via the n-type semiconductor layer 85. Similarly, the p gate Gp of the shift thyristor T(1) and the base B of the coupled transistor Q(1) are electrically connected to each other via the p-type semiconductor layer 86. The n gate Gn of the shift thyristor T(1) and the collectors Cf, Cs of the coupled transistor Q(1), both of which are constituted from the n-type semiconductor layer 87, are separated from each other. The same applies to the other shift thyristors T and the coupled transistors Q.

FIGS. 5A and 5B illustrate the layout and a sectional surface of the light source 10. FIG. 5A illustrates the layout, and FIG. 5B illustrates a sectional surface taken along the line VB-VB in FIG. 5A. In FIG. 5A, the shift thyristors T(1) to T(4), the coupled transistors Q(1) to Q(4), the light emission control thyristors S(1) to S(4), and the VCSEL(1) to VCSEL(4) are principally illustrated. In FIG. 5B, a sectional surface of the light emission control thyristor S(1), the VCSEL(1), the shift thyristor T(1), the coupled transistor Q(1), and the coupled resistor Rc and the power source line resistor Rg connected to the coupled transistor Q(l) is illustrated.

As illustrated in FIG. 5B, the light source 10 is constituted by stacking, on the n-type semiconductor substrate 80, an n-type semiconductor layer 81, an active layer 82, a p-type semiconductor layer 83, a tunnel junction layer 84, an n-type semiconductor layer 85, a p-type semiconductor layer 86, an n-type semiconductor layer 87, and a p-type semiconductor layer 88. The elements such as the shift thyristor T, the coupled transistor Q, the light emission control thyristor S, and the VCSEL are constituted from a plurality of islands separated from each other by removing some of semiconductor layers through etching. The islands are occasionally referred to as "mesas", and the etching for forming the islands (mesas) is occasionally referred to as "mesa etching". In the following, the islands (300, 301 to 307) will be described, principally on an island 301 provided with the light emission control thyristor S(1) and the VCSEL(1), an island 302 provided with the shift thyristor T(1) and the coupled transistor Q(1), etc.

The island 300 is a portion which is provided with the shift section 12 (see FIG. 3) with the shift thyristor T(1), the coupled transistor Q(1), etc., and in which the n-type semiconductor layer 81, the active layer 82, the p-type semiconductor layer 83, the tunnel junction layer 84, and the n-type semiconductor layer 85 remain on the n-type semiconductor layer 80 without being removed.

The island 301 is provided with the VCSEL(1) and the light emission control thyristor S(1) as stacked thereon. The island 302 is provided with the shift thyristor T(1) and the coupled transistor Q(1) illustrated in FIG. 2B. The island 303 is provided with the current limiting resistor RL, and the island 304 is provided with the power source line resistor Rg and the coupled resistor Rc. The island 305 is provided with the power source line resistor Rg and the start resistor Rs. The island 306 is provided with the current limiting resistor R1, and the island 307 is provided with the current limiting resistor R2.

In the following, the layout and the sectional surface will be described with reference to FIGS. 5A and 5B.

The n-type semiconductor layer 81, the active layer 82, the p-type semiconductor layer 83, the tunnel junction layer 84, the n-type semiconductor layers 85, 87, and the p-type semiconductor layers 86, 88 around the island 301 have been removed through etching. A p ohmic electrode 321 that easily makes ohmic contact with a p-type semiconductor layer is provided on the p-type semiconductor layer 88. An n ohmic electrode 331 that easily makes ohmic contact with an n-type semiconductor layer is provided on the n-type semiconductor layer 87, which is exposed by removing the p-type semiconductor layer 88. The VCSEL(1) includes the n-type semiconductor layer 81 as the cathode K (see FIG. 4A), the active layer 82 as the active layer, and the p-type semiconductor layer 83 as the anode A (see FIG. 4A). The light emission control thyristor S(1) includes the n-type semiconductor layer 85 as the cathode K, the p-type semiconductor layer 86 as the p gate Gp (p gate layer), the n-type semiconductor layer 87 as the n gate Gn (n gate layer), and the p-type semiconductor layer 88 as the anode A. The n ohmic electrode 331 is used as the n gate Gn of the light emission control thyristor S(1).

As illustrated in FIG. 5B, the VCSEL(1) is provided on the n-type semiconductor substrate 80, and the light emission control thyristor S(1) is stacked on the VCSEL(1) via the tunnel junction layer 84. The tunnel junction layer 84 suppresses a state in which a current does not flow easily with a reverse bias applied between the p-type semiconductor layer 83 of the VCSEL(1) and the n-type semiconductor layer 85 of the light emission control thyristor S(1). The tunnel junction layer 84 is a junction of an $n^{++}$ layer to which a high concentration of n-type impurities has been added and a $p^{++}$ layer to which a high concentration of p-type impurities has been added, and allows a current to flow because of a tunnel effect, even when a reverse bias is applied.

The island 301 has a circular column shape except for a portion provided with the n ohmic electrode 331. The p ohmic electrode 321 is provided in an annular shape on the p-type semiconductor layer 88 of the island 301 which is in a circular column shape. A part of the semiconductor layer that constitutes the p-type semiconductor layer 83 which is exposed through etching is oxidized from the outer peripheral portion of the circular column shape to form a current blocking portion β in an annular shape that does not allow a current to flow easily therethrough. On the other hand, the central portion which is not oxidized forms a current passage portion α that allows a current to flow easily therethrough. Light is output from the central portion of the p ohmic electrode 321 in an annular shape. The current blocking portion β is constituted by providing the p-type semiconductor layer 83 with an AlAs layer or an AlGaAs layer with a high Al concentration and oxidizing Al by oxidizing the AlAs layer or the AlGaAs layer from the exposed outer peripheral portion.

In FIGS. 5A and 5B, the VCSEL(1) outputs light through the light emission control thyristor S(1). The light emission control thyristor S(1) (the tunnel junction layer 84, the n-type semiconductor layers 85, 87, and the p-type semiconductor layers 86, 88) in a portion of the island 301 through which light is output may be removed. In this case, the light emission control thyristor S(1) is in a cylindrical shape.

The p-type semiconductor layer 86, the n-type semiconductor layer 87, and the p-type semiconductor layer 88 have been removed through etching around the island 302 (see FIG. 4B). A p ohmic electrode 322 is provided on the p-type semiconductor layer 88. The p ohmic electrode 322 is an electrode (anode A electrode) connected to the anode A of the shift thyristor T(1), and is connected to the shift signal line 72-1, to which the shift signal p1 (ϕ1) is supplied. There are n ohmic electrodes 332, 333, 334 provided on the n-type semiconductor layer 87, which is exposed by removing the p-type semiconductor layer 88. The n ohmic electrodes 332, 334 are electrodes (collector Cf, Cs electrodes) connected to the collectors Cs, Cf of the coupled transistor Q(1). The n-type semiconductor layer 87 between the p ohmic electrode 322 and the n ohmic electrodes 332, 334 has been removed (see FIG. 4B). The n ohmic electrode 333 is an electrode (n gate Gn electrode) connected to the n gate Gn of the shift thyristor T(1).

The p-type semiconductor layer 86, the n-type semiconductor layer 87, and the p-type semiconductor layer 88 have been removed through etching around the island 303. Further, the p-type semiconductor layer 88 has been removed through etching from the island 303 (see the island 304 illustrated in FIG. 5B). Two n ohmic electrodes 335, 336 are provided on the exposed n-type semiconductor layer 87. The n-type semiconductor layer 87 between the two n ohmic electrodes 335, 336 is the current limiting resistor RL.

The p-type semiconductor layer 86, the n-type semiconductor layer 87, and the p-type semiconductor layer 88 have been removed through etching around the island 304. Further, the p-type semiconductor layer 88 has been removed through etching from the island 304. Three n ohmic electrodes 337, 338, 339 are provided on the exposed n-type semiconductor layer 87. The n-type semiconductor layer 87 between the n ohmic electrodes 337, 338 is the coupled resistor Rc, and the n-type semiconductor layer 87 between the n ohmic electrodes 338, 339 is the power source line resistor Rg.

The island 305 is constituted similarly to the island 304, and provided with a start resistor Rs and a power source line resistor Rg. The islands 306, 307 are constituted similarly to the island 303, and provided with current limiting resistors R1, R2.

The n ohmic electrode 338 is provided on the exposed n-type semiconductor layer 85 of the island 300. The substrate electrode 75 is provided on the back surface of the p-type semiconductor substrate 80.

Next, the connection relationship will be described. In FIG. 5A, wires (the power source line 71, the shift signal lines 72-1, 72-2, and the light emission potential line 74) that are used for connection are indicated by straight lines.

The p ohmic electrode 321, which is the anode A electrode of the light emission control thyristor S(1) of the island 301, is connected to the light emission potential line 74, to which the light emitting potential $V_{LD}$ is supplied. The n ohmic electrode 331, which is the n gate Gn electrode of the light emission control thyristor S(1) of the island 301, is connected to the n ohmic electrode 332, which is the collector Cs electrode of the coupled transistor Q(1) of the island 302. The n ohmic electrode 332 is connected to the n ohmic electrode 336 of the current limiting resistor RL which is provided on the island 303. The n ohmic electrode 335 of the island 303 is connected to the light emission potential line 74.

The p ohmic electrode 322, which is the anode A electrode of the shift thyristor T(1) of the island 302, is connected to the shift signal line 72-1. The shift signal line 72-1 is connected to the ϕ1 terminal, to which the shift signal p1 is supplied, via the current limiting resistor R1 which is provided on the island 306. The n ohmic electrode 333, which is the n gate Gn electrode of the shift thyristor T(1) of the island 302, is connected to an n ohmic electrode (no symbol) which is the connection point between the power source line resistor Rg and the start resistor Rs which are provided on the island 305. The n ohmic electrode 334, which is the collector Cf electrode of the coupled transistor Q(1) of the island 302, is connected to the n ohmic electrode 337 on one side of the coupled resistor Rc of the island 304.

The n ohmic electrode 338 on the other side of the coupled resistor Rc of the island 304 is connected to an n ohmic electrode (no symbol) which is the n gate Gn electrode of the shift thyristor T(2). The n ohmic electrode 339 on the other side of the power source line resistor Rg of the island 304 is connected to the power source line 71, to which the power source potential VGK is supplied.

An n ohmic electrode (no symbol) on one side of the start resistor Rs of the island 305 is connected to the shift signal line 72-2. An n ohmic electrode (no symbol) on the other side of the power source line resistor Rg of the island 305 is connected to the power source line 71. The shift signal line 72-2 is connected to the ϕ2 terminal, to which the shift signal p2 (ϕ2) is supplied, via the current limiting resistor R2 which is provided on the island 307.

The shift signal line 72-1 is connected to the p ohmic electrodes which are the anode A electrodes of the odd-numbered shift thyristors T, and the shift signal line 72-2 is connected to the p ohmic electrodes which are the anode A electrodes of the even-numbered shift thyristors T.

The other shift thyristors T, coupled transistors Q, light emission control thyristors S, and VCSELs are constituted similarly to the shift thyristor T(1), the coupled transistor Q(1), the light emission control thyristor S(1), and the VCSEL(1), respectively.

The n ohmic electrode 338 of the exposed n-type semiconductor layer 85 of the island 300 is the $V_C$ terminal, to which the control potential $V_C$ is supplied. The control potential $V_C$ is supplied to the n-type semiconductor layer 85, the tunnel junction layer 84, and the p-type semiconductor layer 83 via the n ohmic electrode 338. Hence, the p-type semiconductor layer 83 is referred to as the control potential layer 73. The control potential layer 73 may also include the n-type semiconductor layer 85 and the tunnel junction layer 84, which are at the same potential as the p-type semiconductor layer 83. The back surface electrode which is provided on the back surface of the n-type semiconductor substrate 80 is referred to as the substrate electrode 75. The substrate electrode 75 is the $V_K$ terminal, to which the substrate potential $V_K$ is supplied.

As illustrated in FIG. 5B, the shift section 12, which is constituted from the shift thyristor T, the coupled transistor Q, the power source line resistor Rg, the coupled resistor Rc, the start resistor Rs, and the current limiting resistors RL, R1, R2, is provided on the stacked semiconductor layers (the n-type semiconductor layer 81, the active layer 82, and the p-type semiconductor layer 83) which constitute the VCSEL. The stacked semiconductor layers (the n-type semiconductor layer 81, the active layer 82, and the p-type semiconductor layer 83) under the shift section 12 does not function as the VCSEL. That is, the shift section 12 is constituted by stacking the n-type semiconductor layer 85, the p-type semiconductor layer 86, the n-type semiconductor layer 87, and the p-type semiconductor layer 88 on the stacked semiconductor layers (the n-type semiconductor layer 81, the active layer 82, and the p-type semiconductor layer 83) which constitute the VCSEL, without removing the stacked semiconductor layers. The stacked semiconductor layers, on which the shift section 12 is provided, are expressed as a "structure that is equivalent to the VCSEL (light emitting element)".

As described above, the light source 10 is a semiconductor component provided on a single semiconductor substrate (n-type semiconductor substrate 80).

Waveform of Light Emission Pulses of Light Emitting Device 1

The waveform (hereinafter referred to as a "light emission pulse waveform") of light emission pulses for the light emitting device 1 including the shift section 12 and a light emitting device (not illustrated) not including the shift section 12 will be described. For the light emitting device 1 including the shift section 12, as discussed earlier, the control potential $V_C$ is set to the ground potential GND (0 V). The light emitting device not including the shift section 12 includes only the light emission control thyristors S and the VCSELs, which are connected in series with each other, in FIGS. 3, 4A, and 4B, and the light emission control thyristor S connected to the VCSEL to be caused to emit light is controlled in accordance with a signal from the outside.

Figure 6A:
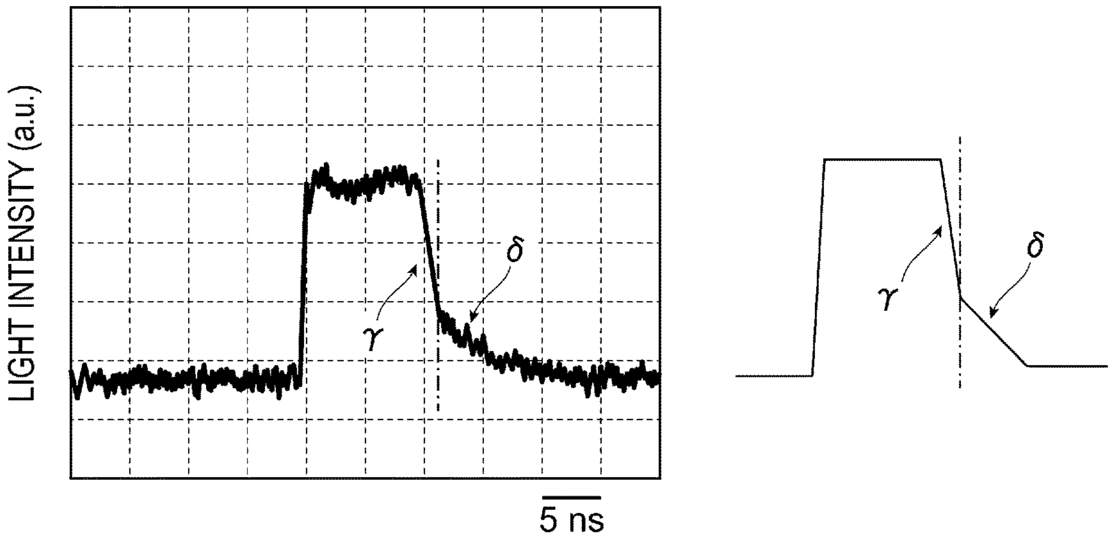
Figure 6B:
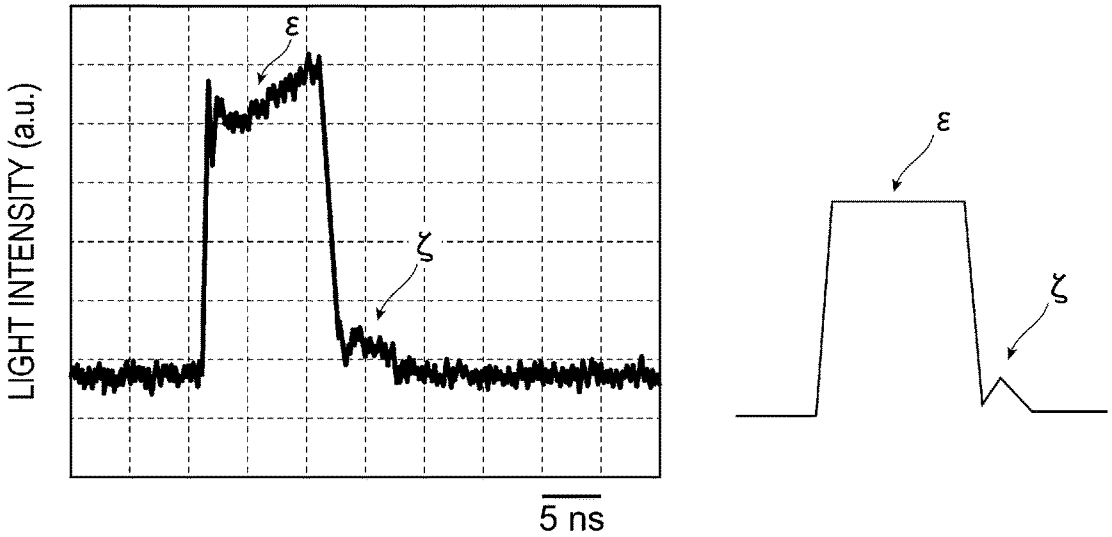
Figure 6C:
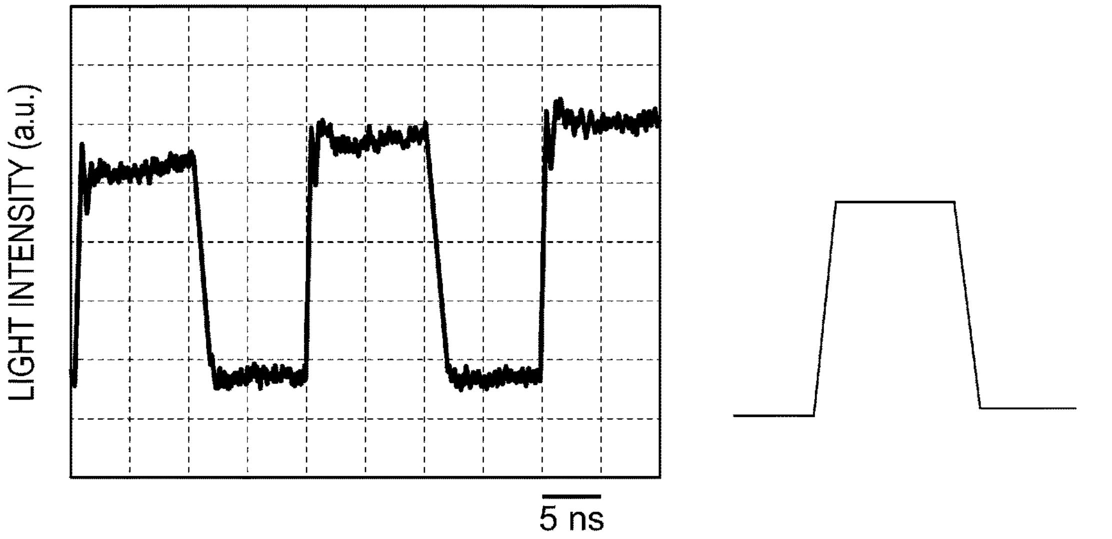

FIGS. 6A to 6C illustrate the waveform of light emission pulses from the VCSEL in the light emitting device 1. FIGS. 6A and 6B illustrate the waveform of light emission pulses from the VCSEL in the light emitting device 1 including the shift section 12, and FIG. 6C illustrates the waveform of light emission pulses from a VCSEL in a light emitting device (not illustrated) not including a shift section. In FIGS. 6A, 6B, and 6C, a light emission pulse waveform is illustrated on the left side, and a schematic chart of the light emission pulse waveform is illustrated on the right side. In the light emission pulse waveform illustrated on the left side, the horizontal axis represents the time with each scale indicating 5 ns, and the vertical axis represents the light intensity (a.u.).

The waveform of light emission pulses from the VCSEL in the light emitting device not including the shift section indicated in FIG. 6C has a rise and a fall with a constant gradient as indicated in the schematic chart on the right side.

On the contrary, the light emission pulse waveform indicated in FIG. 6A has a falling portion with a varied gradient as indicated in the schematic chart on the right side. That is, the falling portion has two portions with different gradients. The portion indicated by the arrow δ has a gentle gradient compared to the portion indicated by the arrow γ. The portion indicated by the arrow δ is called "shoulder". When the light emission pulse waveform has a shoulder at the falling portion, the falling time is extended compared to the case where the light emission pulse waveform does not have a shoulder (case in FIG. 6C).

The light emission pulse waveform indicated in FIG. 6B has a first peak indicated by the arrow δ and a second peak indicated by the arrow ζ at the falling portion of the first peak as indicated in the schematic chart on the right side. That is, when the light emission pulse waveform has a second peak at the falling portion, the falling time is extended compared to the case where the light emission pulse waveform does not have a second peak (case in FIG. 6C).

Next, the reason for having a shoulder or a second peak at the falling portion of the light emission pulse waveform in the case where the control potential $V_C$ is set to the ground potential GND (0 V) in the light emitting device 1 including the shift section 12 will be described.

FIG. 7A is an enlarged sectional view of the light source 10, and FIG. 7B illustrates a circuit that is equivalent to a portion indicated in the enlarged sectional view. In FIG. 7A, in order to illustrate a pn junction, the n-type semiconductor substrate 80 is indicated as n; the n-type semiconductor layer 81 in the VCSEL is indicated as n and the p-type semiconductor layer 83 in the VCSEL is indicated as p in the light emitting section 11; and the light emission control thyristor S is provided on the VCSEL. The active layer 82 and the tunnel junction layer 84 are not illustrated.

In the shift section 12, the n-type semiconductor layer 81 is indicated as n, and the p-type semiconductor layer 83 is indicated as p. The shift thyristor T and the coupled transistor Q are provided on the p-type semiconductor layer 83 as the shift section 12. The active layer 82 and the tunnel junction layer 84 are not illustrated.

As illustrated in FIG. 5A, the $V_C$ terminal, to which the control potential $V_C$ is supplied, is connected to the n-type semiconductor layer 85 which constitutes the shift thyristor T and the coupled transistor Q. As discussed earlier, however, the n-type semiconductor layer 85 is provided on the p-type semiconductor layer 83 via the tunnel junction layer 84. The tunnel junction layer 84 is provided so that a reverse bias is applied between the n-type semiconductor layer 85 and the p-type semiconductor layer 83. Hence, the n-type semiconductor layer 85 and the p-type semiconductor layer 83 are at the same potential as each other. Thus, in FIG. 7A, the $V_C$ terminal is illustrated as being connected to the p-type semiconductor layer 83. As discussed earlier, the p-type semiconductor layer 83 is the control potential layer 73.

The drain of the NMOS transistor in the driver Drv2 is connected to the substrate electrode 75, which is provided on the back surface of the n-type semiconductor substrate 80. The source of the NMOS transistor is set to the ground potential GND (0 V). Hence, the substrate potential $V_K$ is supplied to the substrate electrode 75.

When the driver Drv2 is on, a current flows from the light emitting potential $V_{LD}$ (7 V) toward the driver Drv2 via the light emission control thyristor S and the VCSEL. At this time, the substrate potential $V_K$ is about 2 V (indicated as "~2 V"), for example, because of the internal resistance (resistor Rv illustrated in FIG. 7B) in the light emitting section 11.

In the shift section 12, the $V_C$ terminal is set to the ground potential GND (0 V). Therefore, a reverse bias is applied to the pn junction between the n-type semiconductor layer 81 (~2 V) and the p-type semiconductor layer (0 V) in the shift section 12. That is, the pn junction between the n-type semiconductor layer 81 and the p-type semiconductor layer 83 constitute a capacitor, and stores charge. The capacitor constituted by the pn junction between the n-type semiconductor layer 81 and the p-type semiconductor layer 83 in the shift section 12 is the capacitor section 13. The control potential $V_C$ of the $V_C$ terminal is the potential of the p-type semiconductor layer 83 which constitutes the capacitor. The n-type semiconductor layer 81 is provided on the n-type semiconductor substrate 80, and is at the same potential as the n-type semiconductor substrate 80. The substrate electrode 75, which is the back surface electrode of the n-type semiconductor substrate 80, is at the substrate potential $V_K$. The n-type semiconductor substrate 80 and the n-type semiconductor layer 81 are at the substrate potential $V_K$. Hence, a voltage difference between the control potential $V_C$ and the substrate potential $V_K$ is applied to the capacitor constituted by the pn junction between the n-type semiconductor layer 81 and the p-type semiconductor layer 83.

In the equivalent circuit illustrated in FIG. 7B, the light emitting section 11 is represented as a parallel connection of the VCSEL, the light emission control thyristor S, and the internal resistor Rv, which are connected in series with each other, and a capacitor $C_1$. As illustrated in FIG. 3, the light emitting section 11 is constituted by a parallel connection of a plurality of series connections of a VCSEL and a light emission control thyristor S. Hence, series connections of a VCSEL and a light emission control thyristor S other than the VCSEL to be caused to emit light (the series connection of the VCSEL and the light emission control thyristor S) constitute the capacitor $C_1$, which is connected in parallel with the VCSEL to be caused to emit light (the series connection of the VCSEL and the light emission control thyristor S). The internal resistor Rv is a resistor to a current that flows through the VCSEL and the light emission control thyristor S, which are connected in series with each other. That is, the internal resistor Rv is a resistor included inside the VCSEL and the light emission control thyristor S, and not a resistor provided externally. For example, the internal resistor Rv has a resistance that becomes larger as the current passage portion α of the VCSEL becomes smaller (narrower). In the divided irradiation, the internal resistor Rv has a resistance that becomes larger as the number of the irradiated areas 210 becomes larger and the number of VCSELs to be caused to emit light concurrently becomes smaller. In FIG. 7B, the potential at the connection point between the VCSEL and the internal resistor Rv is an internal potential $V_R$. The capacitor $C_1$ is an example of a first capacitor.

As discussed above, on the other hand, the capacitor section 13 is represented as a parallel connection of a capacitor $C_2$ and a pn junction (indicated by symbol for a diode in FIG. 7B) constituted from the n-type semiconductor layer 81 and the p-type semiconductor layer 83. The capacitor $C_2$ is an example of a second capacitor.

Only the shift thyristors T are illustrated for the shift section 12, for simplification of illustration. The shift section 12 does not affect the light emission pulse waveform. The shift section 12 will not be described below.

As illustrated in FIG. 7A, the capacitor $C_2$ of the capacitor section 13 is provided under the shift section 12. Hence, the capacitor $C_2$ has a capacitance that becomes larger as the area occupied by the shift section 12 in the light source 10 becomes larger. As seen from the layout diagram in FIG. 5A illustrated by way of example, the area occupied by the shift section 12 is not small compared to the light emitting section 11. That is, the capacitance of the capacitor $C_2$ of the shift section 12 is not small compared to that of the capacitor $C_1$ of the light emitting section 11, and the capacitor $C_2$ affects the light emission pulse waveform.

The light source 10 is provided on a single semiconductor substrate (n-type semiconductor substrate 80). That is, the light emitting section 11 and the capacitor section 13 are connected to each other by the n-type semiconductor substrate 80 and the substrate electrode 75. The resistance between the light emitting section 11 and the capacitor section 13 is determined in accordance with the area of the n-type semiconductor substrate 80 and the substrate electrode 75. The capacitor section 13 may be provided separately from the light emitting section 11. In this case, the light emitting section 13 and the capacitor section 13 are connected to each other through wires. That is, when the light emitting section 11 and the capacitor section 13 are provided on a single semiconductor substrate (n-type semiconductor substrate 80), the resistance between the light emitting section 11 and the capacitor section 13 is suppressed compared to the case where the light emitting section 11 and the capacitor section 13 are connected to each other through wires.

Next, the effect of the capacitor section 13 on the light emission pulse waveform will be described.

Figures 8A, 8B, 8C, 8D:
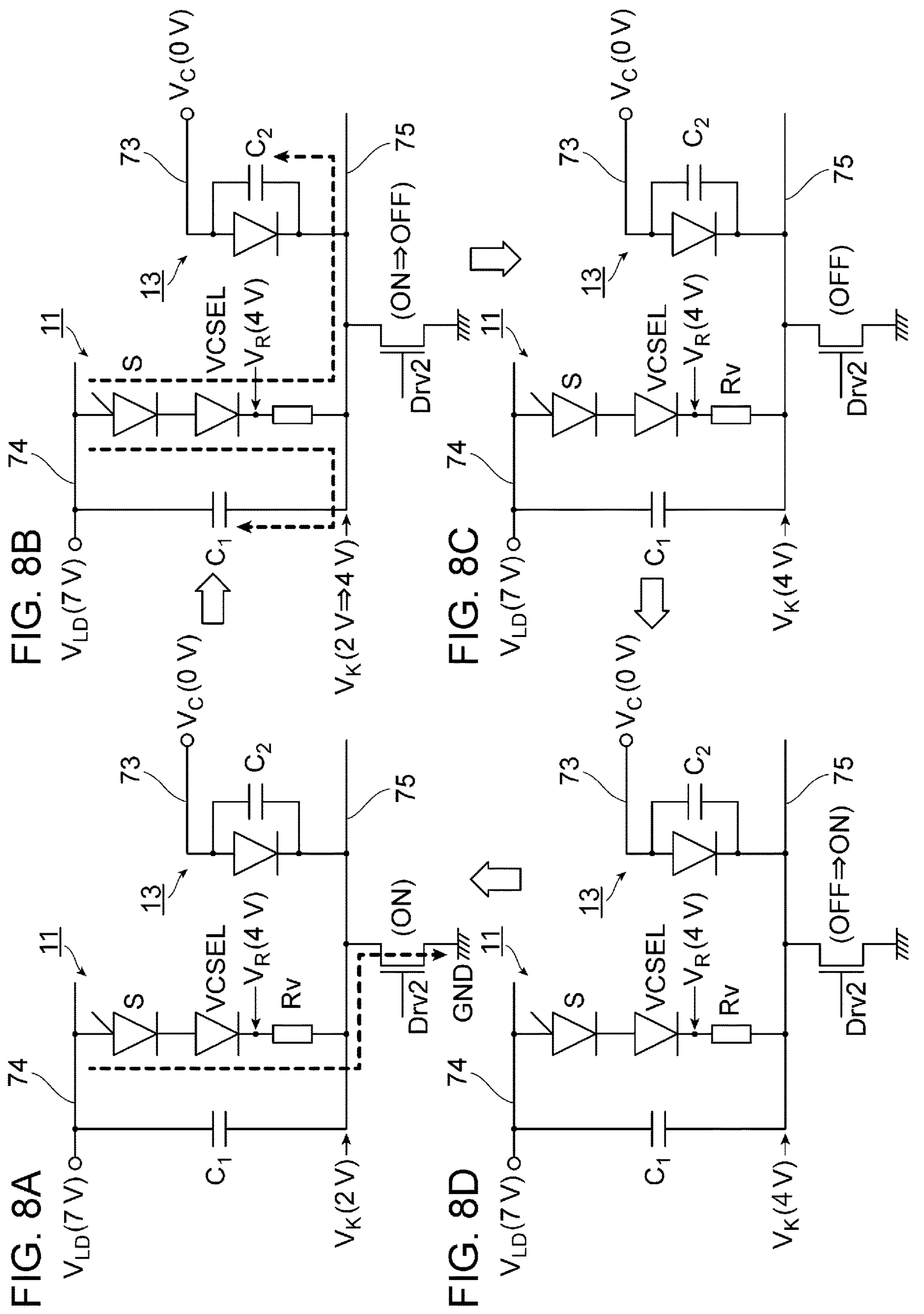

FIGS. 8A to 8D illustrate the effect of the capacitor section 13 on the waveform of light emission pulses in the light emitting device 1. FIG. 8A illustrates a case where the driver Drv2 is turned on, FIG. 8B illustrates a case where the driver Drv2 is switched from on to off, FIG. 8C illustrates a case where the driver Drv2 is turned off, and FIG. 8D illustrates a case where the driver Drv2 is switched from off to on. It is assumed that the light emitting potential $V_{LD}$ is 7 V. It is also assumed that the control potential $V_C$ is fixed at the ground potential GND (0 V). In FIGS. 8A, 8B, 8C, and 8D, the driver Drv2 is indicated as "ON" when it is turned on, and indicated as "OFF" when it is turned off. The same applies hereinafter. The path of the light emission current is indicated by the broken line.

In the case where the driver Drv2 is turned on, as illustrated in FIG. 8A, the light emission control thyristor S is in the on state, and the VCSEL emits light. That is, a light emission current flows from the $V_{LD}$ terminal, to which the light emitting potential $V_{LD}$ (7 V) is supplied, toward GND by way of the light emission control thyristor S, the VCSEL, the internal resistor Rv, and the driver Drv2. It is assumed that the forward voltage Vd is 1.5 V. Hence, the voltage applied to the light emission control thyristor S in the on state is 1.5 V, and the voltage applied to the VCSEL emitting light is 1.5 V. Hence, the internal potential $V_R$ is brought to 4 V. That is, a voltage of 3 V is applied to the series connection of the light emission control thyristor S and the VCSEL. At this time, the substrate potential $V_K$ is 2 V. A voltage of 2 V is applied to the internal resistor Rv.

When the driver Drv2 is switched from on to off, as illustrated in FIG. 8B, the light emission current which has been flowing through the light emission control thyristor S, the VCSEL, and the internal resistor Rv, which are connected in series with each other, falls with a time constant $(C_1+C_2)\times Rv$ determined in accordance with the parallel capacitance of the capacitor $C_1$ and the capacitor $C_2$ and the resistance of the internal resistor Rv. Then, the substrate potential $V_K$ rises from 2 V toward 4 V. During a period in which the substrate potential $V_K$ rises from 2 V toward 4 V, a voltage of 3 V is applied to the series connection of the light emission control thyristor S and the VCSEL, and thus the light emission control thyristor S is in the on state and the VCSEL continuously emits light.

When the substrate potential $V_K$ is brought to 4 V when the driver Drv2 is turned off, as illustrated in FIG. 8C, the light emission control thyristor S is switched from the on state to the off state, and the VCSEL stops emitting light (light is extinguished). That is, the VCSEL is brought into a state in which light is extinguished. Then, variations in the substrate potential $V_K$ are stopped. At this time, the internal potential $V_R$ is brought to 4 V, which is the same as the substrate potential $V_K$.

When the driver Drv2 is switched from off to on, as illustrated in FIG. 8D, the light emission current rises with a time constant determined in accordance with the parallel capacitance of the capacitor $C_1$ and the capacitor $C_2$ and the on resistance of the driver Drv2. The on resistance of the driver Drv2 is smaller than the resistance of the internal resistor Rv. Hence, the light emission current rises in a short time (rises rapidly) compared to when the light emission current falls. Then, switching is made to the state in FIG. 8A.

In the light emitting element 1, as described above, in the case where the control potential $V_C$ is set to the ground potential GND (0 V), the light emission current falls with the time constant $(C_1+C_2)\times Rv$, which is determined in accordance with the parallel capacitance of the capacitor $C_1$ and the capacitor $C_2$ and the resistance of the internal resistor Rv, when the driver Drv2 is switched from on to off. As discussed earlier, the capacitance of the capacitor $C_2$ is not small compared to that of the capacitor $C_1$. That is, the light emission current flows in a state (referred to as "parallel connection state") in which the capacitor $C_1$ and the capacitor $C_2$ are connected in parallel with each other, and therefore the falling characteristics are degraded with the occurrence of a shoulder or a second peak at a fall.

Figures 9A, 9B, 9C, 9D:
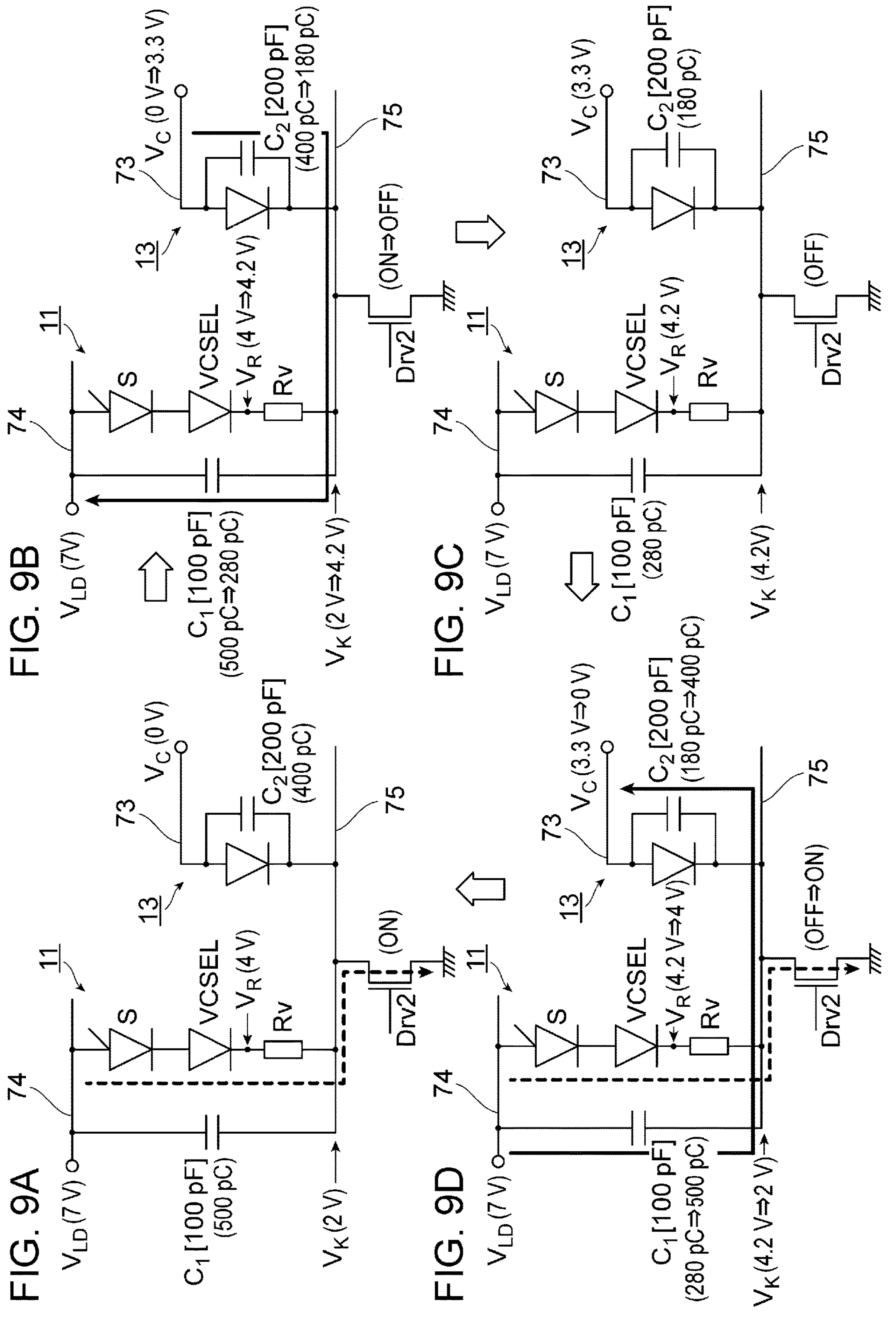

FIGS. 9A to 9D illustrate operation of the light emitting device 1 according to the first exemplary embodiment. FIG. 9A illustrates a case where the driver Drv2 is turned on, FIG. 9B illustrates a case where the driver Drv2 is switched from on to off, FIG. 9C illustrates a case where the driver Drv2 is turned off, and FIG. 9D illustrates a case where the driver Drv2 is switched from off to on. The capacitor $C_1$ has a capacitance of 100 pF, and the capacitor $C_2$ has a capacitance of 200 pF. In FIGS. 9A, 9B, and 9C, the light emission current is indicated by the broken line, and the displacement current is indicated by the solid line.

In the first exemplary embodiment, the control potential $V_C$ is controlled to different potentials in correspondence with whether the driver Drv2 is on or off.

In the case where the driver Drv2 is turned on, as illustrated in FIG. 9A, the control potential $V_C$ is set to the ground potential GND (0 V). This state is the same as the state illustrated in FIG. 8A. That is, the light emission control thyristor S is in the on state, and the VCSEL emits light. A light emission current flows from the $V_{LD}$ terminal, to which the light emitting potential $V_{LD}$ (7 V) is supplied, toward GND by way of the light emission control thyristor S, the VCSEL, the internal resistor Rv, and the driver Drv2. The internal potential $V_R$ is 4 V, and the substrate potential $V_K$ is 2 V. Hence, a voltage of 5 V (=7 V−2 V) is applied to the capacitor $C_1$ with a capacitance of 100 pF, and charge in an amount of 500 pC is stored in the capacitor $C_1$. A voltage of 2 V (=2 V−0 V) is applied to the capacitor $C_2$ with a capacitance of 200 pF, and charge in an amount of 400 pC is stored in the capacitor $C_2$.

When the driver Drv2 is switched from on to off, as illustrated in FIG. 9B, the control potential $V_C$ is switched from 0 V to 3.3 V. Then, the $V_C$ terminal is abruptly switched from the ground potential GND (0 V) to 3.3 V, and a displacement current corresponding to a potential difference of 3.3 V flows from the $V_C$ terminal toward the $V_{LD}$ terminal. Consequently, the amount of charge in the capacitor $C_1$ with a capacitance of 100 pF is varied from 500 pC toward 280 pC, the amount of charge in the capacitor $C_2$ with a capacitance of 200 pF is varied from 400 pC toward 180 pC, and the substrate potential $V_K$ is raised toward 4.2 V. Similarly, the internal potential $V_R$ is also raised from 4 V toward 4.2 V. The VCSEL is turned off when the internal potential $V_R$ becomes more than 4 V. That is, when the internal potential $V_R$ becomes more than 4 V, the voltage applied to the series connection of the light emission control thyristor S and the VCSEL becomes less than 3 V. Therefore, the light emission control thyristor S is not maintained in the on state and is turned off, and the light emission current that flows through the VCSEL is forcibly shut off. The displacement current flows in the state (series connection state) in which the capacitor $C_1$ and the capacitor $C_2$ are connected in series with each other. The time when the control potential $V_C$ is switched from 0 V to 3.3 V may be the timing to switch the driver Drv2 from on to off. The control potential $V_C$ may be switched from 0 V to 3.3 V after the driver Drv2 is turned off, and it is only necessary that the time of fall should be shortened.

In the state in which the light emission current does not flow with the driver Drv2 turned off, as illustrated in FIG. 9C, the control potential $V_C$ is maintained at 3.3 V. Then, the capacitor $C_1$ is maintained in the state of storing charge in an amount of 280 pC, and the capacitor $C_2$ is maintained in the state of storing charge in an amount of 180 pC. The internal potential $V_R$ is maintained at 4.2 V.

When the driver Drv2 is switched from off to on, as illustrated in FIG. 9D, the control potential VC is switched from 3.3 V to 0 V. Then, the $V_C$ terminal is abruptly switched from 3.3 V to 0 V. Consequently, a displacement current corresponding to a potential difference of 3.3 V flows from the $V_{LD}$ terminal toward the $V_C$ terminal to charge the capacitors $C_1$, $C_2$. Then, the substrate potential $V_K$ is abruptly lowered from 4.2 V. At this time, the driver Drv2, which has been turned on, also charges the capacitors $C_1$, $C_2$. That is, the capacitor $C_1$ is charged with the amount of charge increased from 280 pC toward 500 pC, and the capacitor $C_2$ is charged with the amount of charge increased from 180 pC toward 400 pC. When the substrate potential $V_K$ is lowered to 4 V or less, the light emission control thyristor S is turned on, a current starts to flow through the light emission control thyristor S and the VCSEL, which are connected in series with each other, so that the VCSEL starts light emission. Here again, the displacement current flows in the state (referred to as "series connection state") in which the capacitor $C_1$ and the capacitor $C_2$ are connected in series with each other. The time when the control potential $V_C$ is switched from 3.3 V to 0 V may be the timing to switch the driver Drv2 from off to on. The control potential $V_C$ may be switched from 3.3 V to 0 V after the driver Drv2 is turned on, and it is only necessary that the time of rise should be shortened.

Then, returning to FIG. 9A, when the capacitors $C_1$, $C_2$ are charged by the driver Drv2 and the substrate potential $V_K$ is brought to 2 V, the light emission current is brought to a steady value.

Figures 10A, 10B:
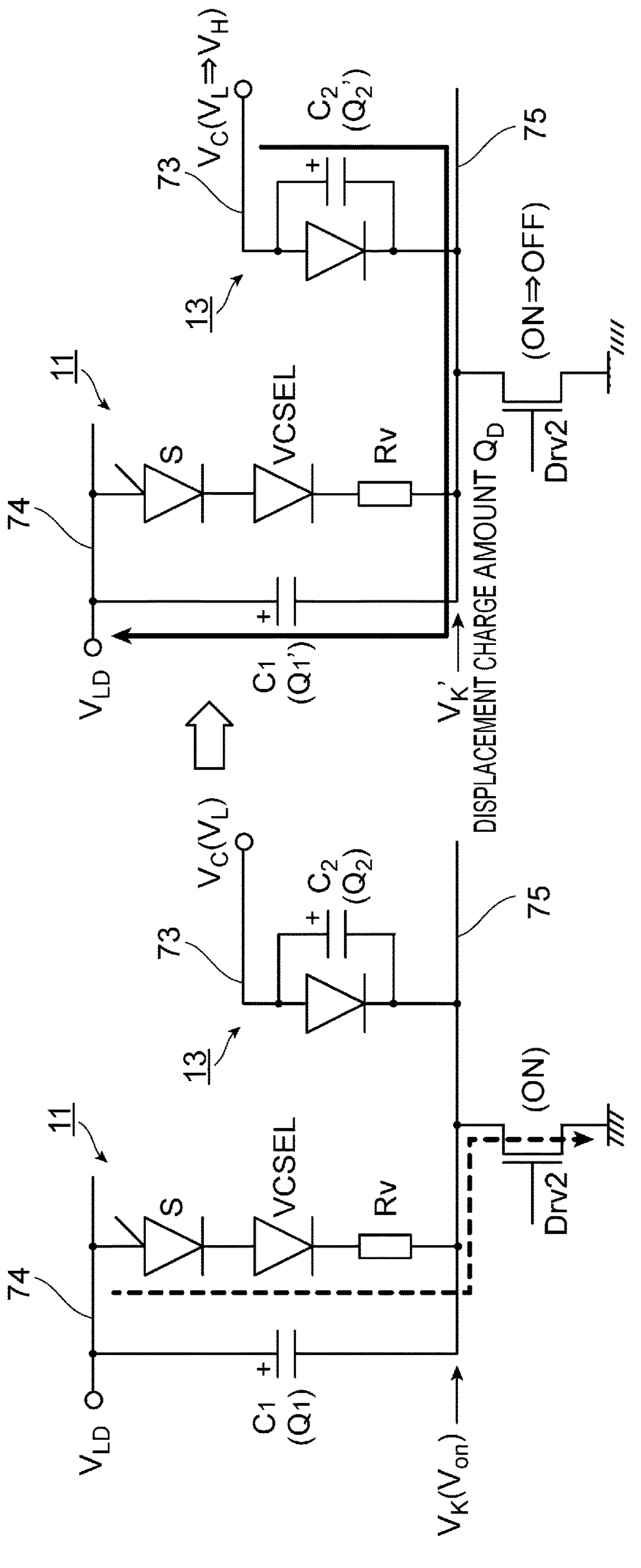

FIGS. 10A and 10B illustrate a generalized form of control for rendering the potential of the control potential $V_C$ different. FIG. 10A illustrates a case where the driver Drv2 is turned on, and FIG. 10B illustrates the case where the driver Drv2 is switched from on to off. The light emission current is indicated by the broken line, and the displacement current is indicated by the solid line. Symbol "+" added to the capacitors $C_1$, $C_2$ indicates positive charge in the case where + charge is stored.

The case where the driver Drv2 is turned on in FIG. 10A is described. The light emission control thyristor S is turned on, and the VCSEL emits light. Hence, a light emission current flows from the $V_{LD}$ terminal toward GND. The substrate potential $V_K$ is $V_{on}$ with the VCSEL in the on state. At this time, the control potential $V_C$ is the potential $V_L$. Then, an amount of charge $Q_1$ stored in the capacitor $C_1$ and an amount of charge $Q_2$ stored in the capacitor $C_2$ are as indicated by Expression 1. In the following, the capacitance value of the capacitor $C_1$ is indicated as "$C_1$", and the capacitance value of the capacitor $C_2$ is indicated as "$C_2$".

$$V_K=V_{on}$$

$$V_C=V_L$$

$$Q_1=C_1(V_{LD}-V_{on})$$

$$Q_2=C_2(V_L-V_{on})$$

Next, the case where the driver Drv2 is switched from on to off in FIG. 10B will be described. The driver Drv2 is switched from on to off, and the control potential $V_C$ is switched from the potential $V_L$ to the potential $V_H$. The potential $V_H$ is higher than the potential $V_L$. This applies to the case where the n-type semiconductor substrate 80 is used, and the polarity is reversed in the case where a p-type semiconductor substrate is used. That is, the potential $V_H$ is higher in absolute value than the potential $V_L$.

When the driver Drv2 is switched from on to off and the control potential $V_C$ is switched from the potential $V_L$ to the potential $V_H$, a displacement current due to the potential difference ($V_H-V_L$) of the control potential $V_C$ flows through the capacitor $C_1$ and the capacitor $C_2$ in series. Then, as indicated by Expression 2, the substrate potential $V_K$ is brought to a substrate potential $V_K'$, the amount of charge $Q_1$ in the capacitor $C_1$ is brought to an amount of charge $Q_1'$, and the amount of charge $Q_2$ in the capacitor $C_2$ is brought to an amount of charge $Q_2'$. From Expression 1 and Expression 2, the substrate potential $V_K'$ is as indicated by Expression 3. An amount of charge $Q_D$ is the amount of charge moved by the displacement current.

$$Q_D=\{C_1C_2/(C_1+C_2)\}\times(V_H-V_L)$$

$$Q_1'=Q_1-Q_D$$

$$Q_2'=Q_2+Q_D$$

$$V_K'=V_H-Q_2'/C_2=V_{LD}-Q_1'/C_1$$

When the voltage (light emitting potential $V_{LD}$–substrate potential $V_K'$) applied to the series connection of the light emission control thyristor S and the VCSEL becomes less than the sum (3 V) of the respective forward voltages Vd (e.g. 1.5 V) of the light emission control thyristor S and the VCSEL, the light emission control thyristor S is turned off and the light emission current is blocked so that light emission is stopped (light is extinguished).

When the substrate potential $V_K'$ is increased, it is easier to stop light emission with the light emission control thyristor S turned off quickly. In order to increase the substrate potential $V_K'$, as seen from Expression 3, it is only necessary to increase the capacitor $C_2$, or increase the potential $V_H$ to be set to the control potential $V_C$. While the capacitor $C_2$ is constituted by the pn junction constituted under the shift section 12, an external capacitor may be added in parallel with the capacitor $C_2$, in order to increase the capacitor $C_2$.

Figure 11A:
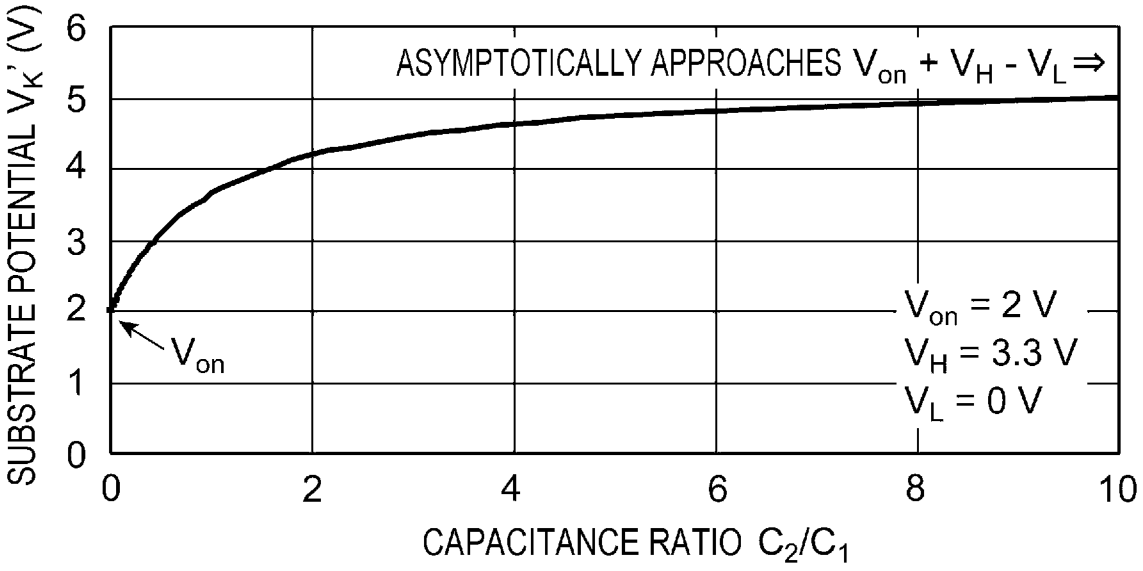
FIGS. 11A and 11B illustrate the relationship between the capacitance ratio and a substrate potential at the time when the driver is turned off, in which FIG. 11A indicates a case where the substrate potential at the time when the driver is on is 2 V and FIG. 11B indicates a case where the substrate potential at the time when the driver is on is 1 V.
Figure 11B:
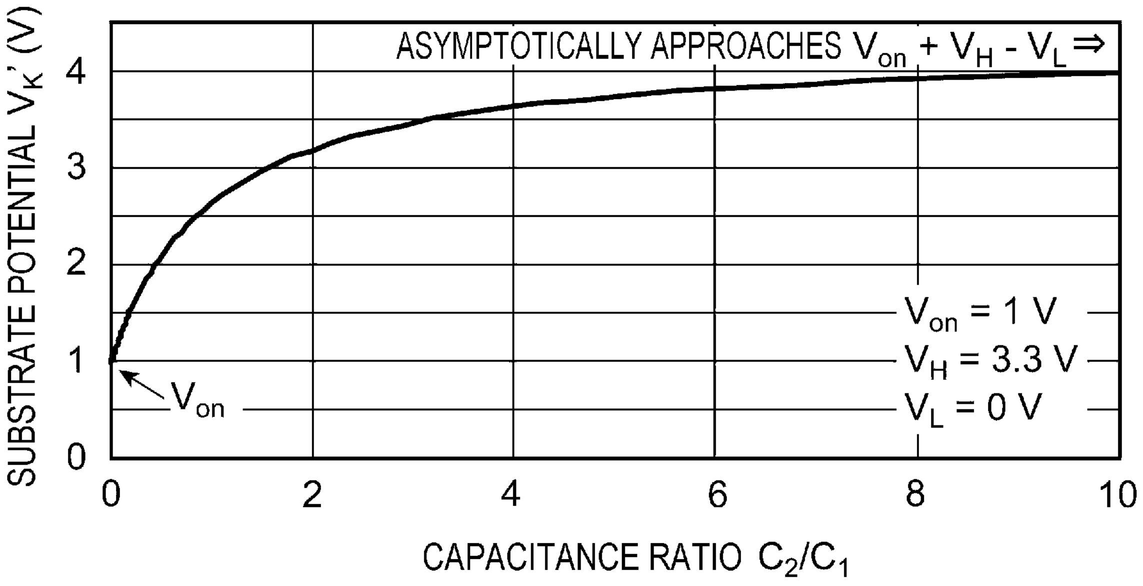

FIGS. 11A and 11B illustrate the relationship between the capacitance ratio of the capacitor $C_2$ to the capacitor $C_1$ and the substrate potential $V_K'$ at the time when the driver Drv2 is turned off. FIG. 11A indicates a case where the substrate potential $V_K$ ($V_{on}$) at the time when the driver Drv2 is on is 2 V, and FIG. 11B indicates a case where the substrate potential $V_K$ ($V_{on}$) at the time when the driver Drv2 is on is 1 V. In FIGS. 11A and 11B, the horizontal axis indicates the capacitance ratio $C_2/C_1$, and the vertical axis indicates the substrate potential $V_K'$ (V) at the time when the driver Drv2 is turned off. The potential $V_L$ of the control potential $V_C$ is defined as the ground potential GND (0 V), and the potential $V_H$ thereof is defined as 3.3 V.

In the case where the substrate potential $V_K$ ($V_{on}$) at the time when the driver Drv2 is on indicated in FIG. 11A is defined as 2 V, the substrate potential $V_K'$ at the time when the driver Drv2 is off is increased from $V_{on}$ (2 V) for the case where the capacitor $C_2$ is 0 to asymptotically approach $V_{on}+V_H-V_L$ (5.3 V) as the capacitance ratio $C_2/C_1$ is increased. The substrate potential $V_K'$ is brought to 4.2 V when the capacitance ratio $C_2/C_1$ is 2. At this time, a voltage $V_{LD}-V_K'$ applied to the light emission control thyristor S and the VCSEL, which are connected in series with each other, is 2.8 V, and light emission from the VCSEL is stopped (light is extinguished). As discussed earlier, light emission from the VCSEL is stopped (light is extinguished) when the substrate potential $V_K'$ is 4 V or more.

In the case where the substrate potential $V_K$ ($V_{on}$) at the time when the driver Drv2 is on indicated in FIG. 11B is defined as 1 V, the substrate potential $V_K'$ at the time when the driver Drv2 is off is increased from $V_{on}$ (1 V) for the case where the capacitor $C_2$ is 0 to asymptotically approach $V_{on}+V_H-V_L$ (4.3 V) as the capacitance ratio $C_2/C_1$ is increased. However, the substrate potential $V_K'$ does not reach 4 V even if the capacitance ratio $C_2/C_1$ is 10. In order to stop light emission from the VCSEL in the case where the capacitance ratio $C_2/C_1$ is 10, it is required to bring the potential $V_H$, which is to be set for the control potential $V_C$, to be higher than 3.3 V.

As described above, as the substrate potential $V_K'$ at the time when the driver Drv2 is off is higher, it is easier to stop light emission with the light emission control thyristor S turned off more quickly. To this end, it is only necessary to increase the potential $V_H$, which is to be set for the control potential $V_C$, or increase the capacitor $C_2$. If the capacitor $C_2$ is increased excessively, however, it takes time to charge and discharge the capacitor $C_2$. Therefore, it is preferable to select the capacitor $C_2$ that renders the difference between the substrate potential $V_K$ ($V_{on}$) at the time when the driver Drv2 is on and the substrate potential $V_K'$ at the time when the driver Drv2 is off large and that renders the capacitance ratio $C_2/C_1$ small, as indicated in FIG. 11A. The capacitance ratio $C_2/C_1$ is preferably 1 or more (once or more), with which the substrate potential $V_K'$ is varied significantly, as indicated in FIG. 11A. Further, the capacitance ratio $C_2/C_1$ is preferably 4 or less (four times or less) in order that the capacitor $C_2$ is not excessively large.

It is assumed that an internal resistor Rd (with a resistance value of Rd) (not illustrated) of the driver Drv1 (see FIG. 1), which controls the control potential $V_C$ to the potential $V_L$ and the potential $V_H$, is sufficiently small. That is, the internal resistor Rd is set so as to meet Expression 4, such that a time constant $Rd\times C_1C_2/(C_1+C_2)$ of a current that flows from the $V_C$ terminal to the capacitor $C_1$ and the capacitor $C_2$ in series is smaller than a time constant $Rv\times(C_1+C_2)$ for the case where the light emission current flows through the capacitor $C_1$ and the capacitor $C_2$ in parallel (see FIG. 8B). Consequently, the displacement current due to control of the control potential $V_C$ flows more quickly than the case (case in FIG. 8B) where the light emission current flows through the capacitor $C_1$ and the capacitor $C_2$ in parallel and fall. Hence, the substrate potential $V_K$ is quickly raised to the substrate potential $V_K'$.

$$R_v\times(C_1+C_2)>>R_d\times C_1C_2/(C_1+C_2)$$

The control potential $V_C$ is set to the potential $V_L$ (0 V by way of example) when the driver Drv2 is turned on, and the control potential $V_C$ is set to the potential $V_H$ (3.3 V by way of example) when the driver Drv2 is turned off. The potentials $V_L$, $V_H$ are preferably potentials at which no forward bias is applied to the pn junction of the capacitor section 13. When a forward bias is applied to the pn junction of the capacitor section 13, a current flows to increase power consumption. The potential $V_H$ is higher in absolute value than the potential $V_L$. If the potential $V_H$ is lower in absolute value than the potential $V_L$, the amounts of charge in the capacitors $C_1$, $C_2$ are increased when the driver Drv2 is turned off, which reduces the substrate potential $V_K$ and conversely extends the time of fall of the light emission pulses.

(Light Emitting Device 2 as Comparative Example)

In the light emitting device 1 according to the first exemplary embodiment, the driver element of the driver Drv2 is an NMOS. Therefore, if the control potential $V_C$ is fixed at the ground potential GND (0V), a light emission current flows through the capacitors $C_1$ and $C_2$ in parallel when the driver Drv2 is turned off. Therefore, the time constant of fall of the light emission current is large. Thus, it is conceivable to use a driver Drv2' obtained by replacing the driver element of the driver Drv2 with a driver element of a complementary type (CMOS configuration) in which an NMOS transistor and a PMOS transistor are combined with each other. That is, the substrate potential $V_K$ may be raised via the PMOS transistor, even if the NMOS transistor is off.

Figure 12:
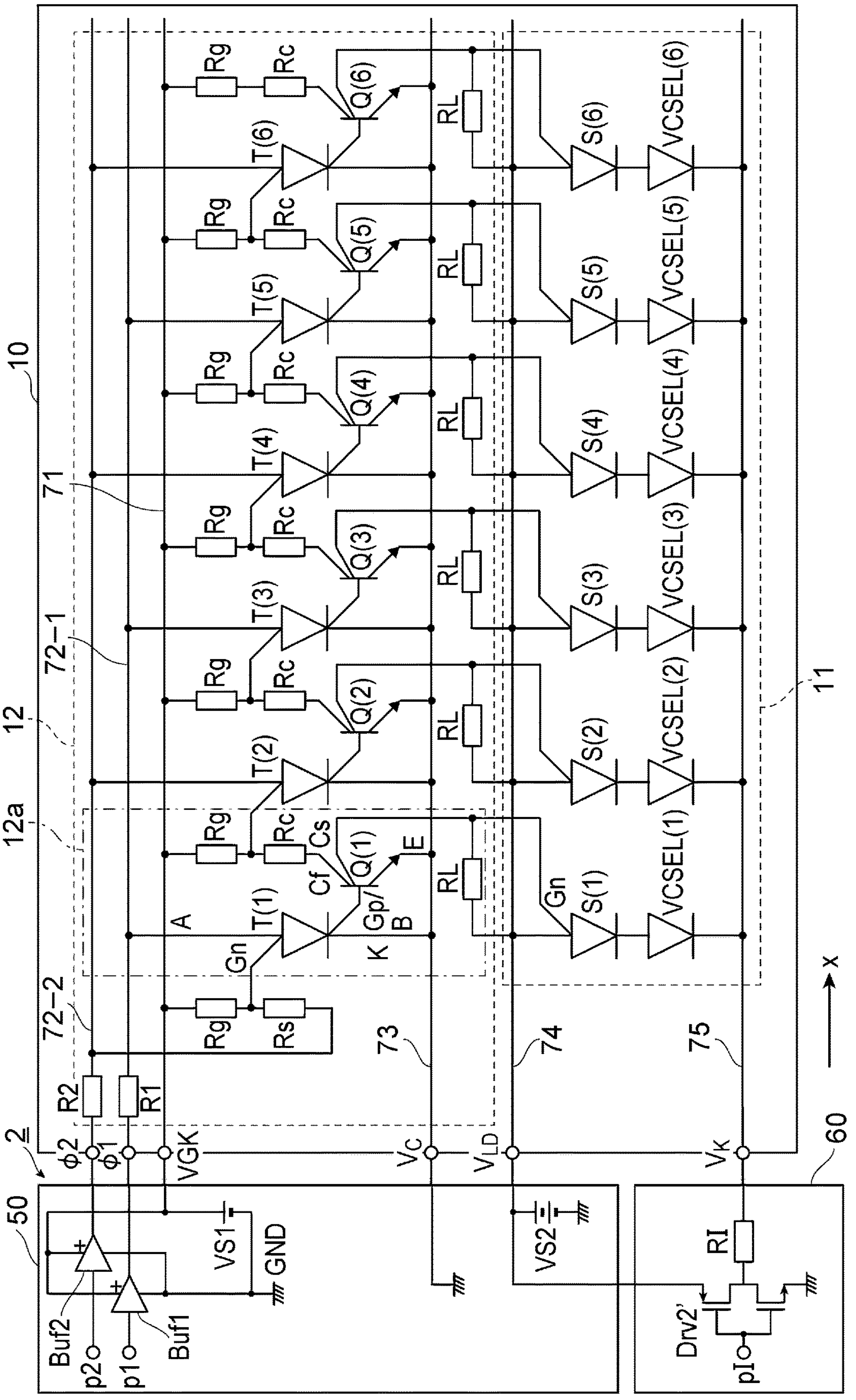
FIG. 12 illustrates a circuit that is equivalent to the light emitting device illustrated for comparison.

FIG. 12 illustrates a circuit that is equivalent to a light emitting device 2 illustrated for comparison. The light emitting device 2 does not include the driver Drv1 in the control section 50 of the light emitting device 1 illustrated in FIG. 3, and the $V_C$ terminal is grounded. Further, the light emitting device 2 includes a driver Drv2' obtained by replacing the NMOS transistor, which is the driver element of the driver Drv2 in the drive section 60 of the light emitting device 1 illustrated in FIG. 3, with a driver element of a CMOS configuration. The source of the NMOS transistor of the driver Drv2' is grounded, and the drain of the PMOS transistor is connected to the light emitting potential $V_{LD}$. The drain of the NMOS transistor and the drain of the PMOS transistor are connected to each other, and connected to the $V_K$ terminal, which supplies a substrate potential $V_K$, via the light emission current limiting resistor RI. The gate of the NMOS transistor and the gate of the PMOS transistor are connected to each other, and receive a light emission signal pI supplied thereto. When the light emission signal pI is at "L" (0 V), the NMOS transistor is turned OFF and the PMOS transistor is turned ON, and the connection point between the drain of the NMOS transistor and the drain of the PMOS transistor is brought to the light emitting potential $V_{LD}$. When the light emission signal pI is at "H" (5 V), on the other hand, the NMOS transistor is turned ON and the PMOS transistor is turned OFF, and the connection point between the drain of the NMOS transistor and the drain of the PMOS transistor is brought to the ground potential GND (0 V). The other components are the same as those of the light emitting device 1.

Figure 13:
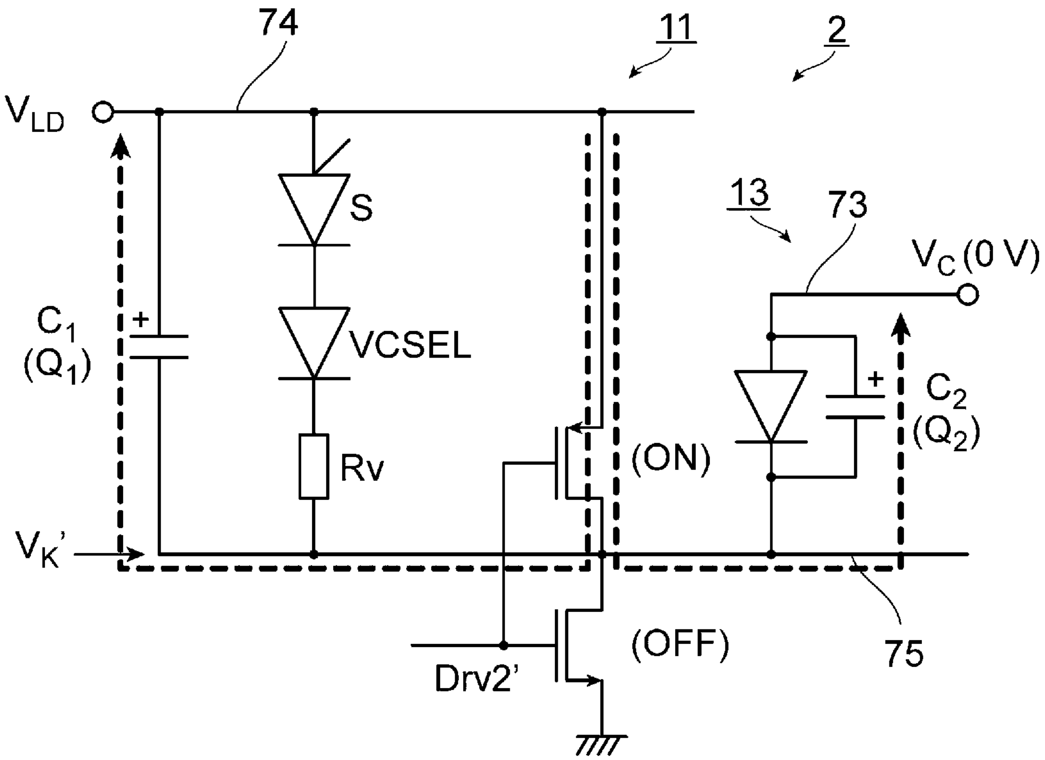
FIG. 13 illustrates a case where the driver is switched from on to off in the light emitting device for comparison.

FIG. 13 illustrates a case where the driver Drv2' is switched from on to off in the light emitting device 2 for comparison. FIG. 13 corresponds to FIG. 10B. In FIG. 13, the light emission current is indicated by the broken line.

As discussed earlier, the source of the PMOS transistor of the driver Drv2' is connected to the $V_{LD}$ terminal. When the light emission signal pI is switched from "H" (5 V) to "L" (0 V), the NMOS transistor of the driver Drv2' is turned off, and the PMOS transistor thereof is turned on. Then, a current flows through the capacitor $C_1$ and the capacitor $C_2$ in parallel via the PMOS transistor. Consequently, the substrate potential $V_K$ is raised to the light emitting potential $V_{LD}$. Hence, the light emission pulses fall quickly.

At this time, when the amount of charge moved is defined as $Q_C$, the amount of charge $Q_C$ is moved through the capacitor $C_1$ and the capacitor $C_2$ in parallel as indicated by Expression 5. Power E consumed by the movement of charge is as indicated by Expression 6. C corresponds to $(C_1+C_2)$, and V corresponds to $(V_{LD}-V_{on})$.

$$Q_C=(V_{LD}-V_{on})\times(C_1+C_2)$$

$$C=CV^2/2=(C_1+C_2)(V_{LD}-V_{on})^2/2$$

In the case where $V_{LD}$ is 7 V, $V_{on}$ is 2V, $C_1$ has a capacitance of 200 pF, $C_2$ has a capacitance of 120 pF, the pulse width of light pulses is 5 ns, and the duty is 5%, power is consumed twice in 100 ns. Hence, the power E to be consumed is calculated as $(200\text{ pF}+100\text{ pF})\times(7\text{ V}-2\text{ V})^2/2\times 2/100$ ns, which results in 0.08 W. When the light emission current is 1 A, on the other hand, the power to be consumed for light emission is calculated as 7 V×1 A×5%, which results in 0.35 W. That is, the power E to be consumed for charge and discharge of the capacitors $C_1$, $C_2$ is 20% or more of the power to be consumed for light emission, and is large. This is because a current flows through the capacitors $C_1$, $C_2$ in parallel. That is, the capacitors $C_1$, $C_2$ have a parallel capacitance of $C_1+C_2$, which results in 320 pF in the above case.

In the first exemplary embodiment in which the control potential $V_C$ is controlled to different potentials, on the other hand, the capacitor $C_1$ and the capacitor $C_2$ seem to be in series with each other, as illustrated in FIG. 9B. Hence, the capacitors $C_1$, $C_2$ have a series capacitance of $C_1C_2(C_1+C_2)$, which results in 75 pF in the above case. Hence, power P to be consumed to charge and discharge the capacitors $C_1$, $C_2$ according to the first exemplary embodiment is calculated as $75\text{ pF}\times(3.3\text{ V})^2/2\times 2/100$ ns, which results in 0.00817 W. That is, the power P to be consumed for charge and discharge in the first exemplary embodiment, in which the control potential $V_C$ is controlled to different values, is about one-tenth of the power E to be consumed for charge and discharge in the case where the driver Drv2' has a CMOS configuration.

When the driver Drv2' has a CMOS configuration, the driver Drv1 (see FIG. 3) which controls the control potential $V_C$ to different potentials is not required. In addition, it is easy to raise the substrate potential $V_K$ to the light emitting potential $V_{LD}$. When the substrate potential $V_K$ is raised to the light emitting potential $V_{LD}$, however, a reverse bias is applied to the light emitting section 11, and charge stored in the light emission control thyristor S and the VCSEL is not easily discharged. Therefore, the memory effect may be kept maintained. Hence, a cancellation unit that cancels the memory effect is needed in the case where the driver Drv2' has a CMOS configuration.

(Measurement Flowchart according to First Exemplary Embodiment)

Next, a measurement flowchart according to the first exemplary embodiment will be described.

Figure 14A:
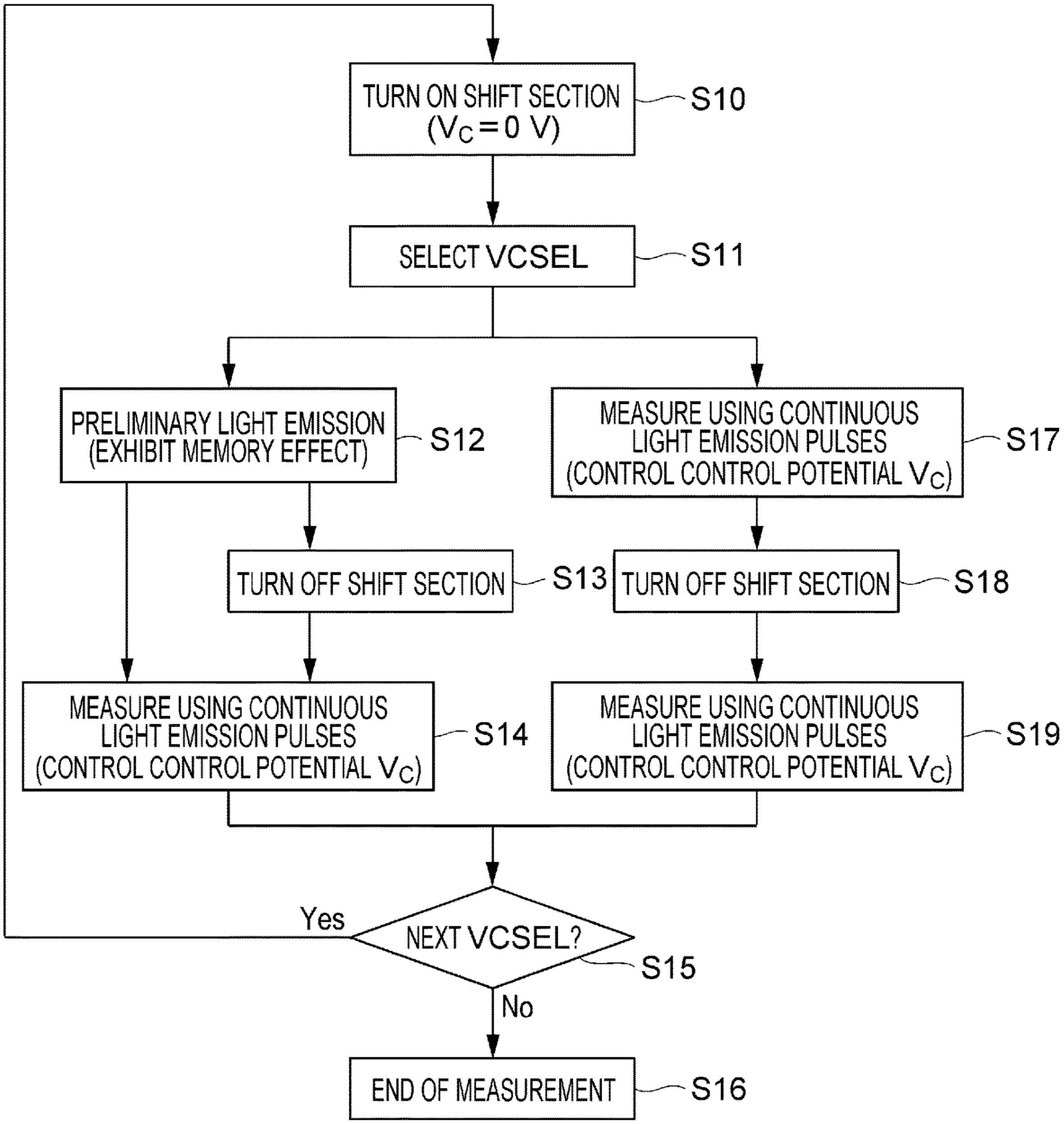
FIG. 14A is a measurement flowchart according to the first exemplary embodiment.
Figure 14B:
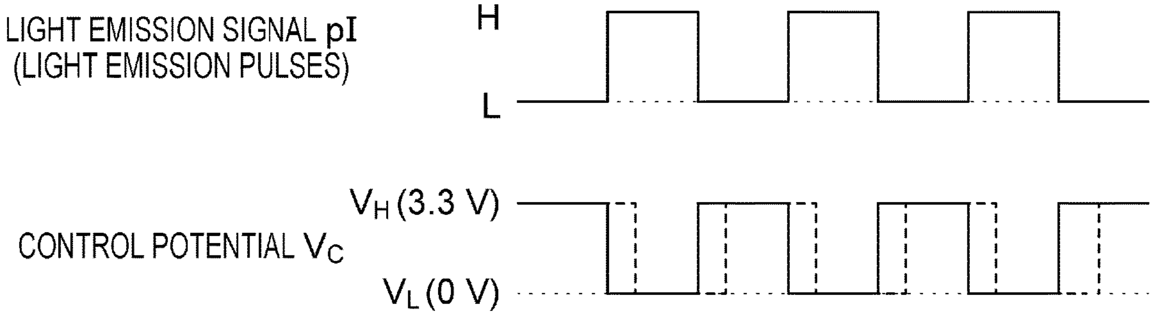
FIG. 14B illustrates control for a control potential.

FIG. 14A is a measurement flowchart according to the first exemplary embodiment. FIG. 14B illustrates control for the control potential $V_C$. In FIG. 14A, the shift section 12 is indicated as "ON" when it is turned on, and indicated as "OFF" when it is turned off. The same applies hereinafter.

First, control for the control potential $V_C$ by the control section 50 indicated in FIG. 14B will be described. The control potential $V_C$ is controlled in correspondence with variations in the light emission signal pI, that is, the light emission pulses. That is, the control potential $V_C$ is switched from the potential $V_H$ (e.g. 3.3 V) to the potential $V_L$ (e.g. 0 V) when (at the timing when) the light emission signal pI is switched from "L" (0 V) to "H" (5 V). Then, the control potential $V_C$ is switched from the potential $V_L$ (e.g. 0 V) to the potential $V_H$ (e.g. 3.3 V) when (at the timing when) the light emission signal pI is switched from "H" (5 V) to "L" (0 V).

The timing when the control potential $V_C$ is switched from the potential $V_H$ (e.g. 3.3 V) to the potential $V_L$ (e.g. 0 V) may not be when (the timing when) the light emission signal pI is switched from "L" (0 V) to "H" (5 V) as discussed above, and may be after the light emission signal pI is switched from "L" (0 V) to "H" (5 V). The timing when the control potential $V_C$ is switched from the potential $V_L$ (e.g. 0 V) to the potential $V_H$ (e.g. 3.3 V) may not be when (the timing when) the light emission signal pI is switched from "H" (5 V) to "L" (0 V), and may be after the light emission signal pI is switched from "H" (5 V) to "L" (0 V). That is, variations in the control potential $V_C$ may be delayed compared to variations in the light emission signal pI as indicated by the broken line in FIG. 14B.

Operation of the light emitting device 1 according to the first exemplary embodiment will be described with reference to FIG. 14A. There are a plurality of flows for operation of the light emitting device 1. First, the flow on the left side is described.

In step 10 (indicated as S10 in FIG. 14A; the same applies to the other steps), the control section 50 turns on the shift section 12. That is, the light emitting device 1 is set to the initial state discussed earlier. At this time, the control potential $V_C$ is set to the ground potential GND (0 V) ($V_L$=0 V). In step 11, the control section 50 selects a VCSEL to be caused to emit light by causing the shift section 12 to operate.

In step 12, the drive section 60 causes the selected VCSEL to emit light. At this time, the control section 50 brings the control potential $V_C$ to 0 V. A memory effect is exhibited by this light emission. This light emission is not used for measurement, and therefore is expressed as "preliminary light emission".

In step 13, the control section 50 turns off the shift section 12. As discussed earlier, the shift signals p1, p2 are brought to "L" (0 V), for example.

In step 14, the drive section 60 turns on and off the driver Drv2, and causes the VCSEL to continuously generate a plurality of light emission pulses (continuous light emission pulses). Light reflected from the object to be measured for the light emission pulses is received by the 3D sensor 5 (see FIG. 1), and charge corresponding to the light emission pulses is stored in a capacitor in the 3D sensor 5. The distance to the object to be measured is measured from the charge stored in accordance with the continuous light emission pulses. At this time, the control section 50 controls the control potential $V_C$ in correspondence with light emission from the VCSEL, as indicated in FIG. 14B. A period for which a plurality of light emission pulses are continuously generated is defined as "light emission time". That is, the control section 50 sets the control potential $V_C$ to the ground potential GND (0 V) during a shift period (when selection is made) in which the shift section 12 performs shift operation, sets the control potential $V_C$ to $V_L$ (ground potential GND (0 V)), which is the same as the value during the shift period (when selection is made), during a certain period of the light emission time, and sets the control potential $V_C$ to the potential $V_H$ (3.3 V), which is different from the value during the shift period (when selection is made), during the other period of the light emission time.

Step 13 may not be performed. That is, the control section 50 may not turn off the shift section 12. The VCSEL generates continuous light emission pulses because of the memory effect, even if the shift signal p1 or the shift signal p2 is maintained at "H" (5 V).

In step 15, the control section 50 determines whether or not to cause the next VCSEL to emit light. In the case where it is determined to cause the next VCSEL to emit light (in the case of Yes), the process returns to step 10, in which the light emitting device 1 is brought to the initial state and the shift section 12 is turned ON. After that, measurement is performed in accordance with the flow discussed above. Once the shift section 12 is turned off, information on the VCSEL selected before the shift section 12 is turned off is lost. Thus, in the case where the next VCSEL is caused to emit light, the light emitting device 1 is brought to the initial state, shift operation is started over by the shift thyristor T(1), and the next VCSEL to be caused to emit light is selected.

In the case where it is determined in step 15 not to cause the next VCSEL to emit light (in the case of No), the measurement is ended in step 16.

Next, the flow on the right side is described.

Step 17 and step 19 are consecutive steps, although the steps are indicated as separate steps. As in step 14, the drive section 60 turns on and off the driver Drv2, causes the VCSEL to generate continuous light emission pulses, and measures the distance to the object to be measured. At this time, the control section 50 controls the control potential $V_C$ in correspondence with light emission from the VCSEL, as indicated in FIG. 14B. Also in this case, a memory effect is exhibited once the VCSEL is caused to emit light. Hence, the VCSEL is caused to generate continuous light emission pulses.

In step 18, the control section 50 turns off the shift section 12 quickly after the VCSEL emits light in step 17. When the VCSEL emits light in step 17, a memory effect is exhibited, and thus the shift section 12 is preferably turned off quickly after the VCSEL emits light in step 17.

After that, the processes in and after step 15 discussed earlier are executed.

In the case where a plurality of light emission pulses are generated continuously, a first light pulse occasionally has a light emission pulse waveform that is different, in having a lower peak etc., from that of the other light emission pulses, compared to the subsequent light pulses. In such a case, the first light emission pulse is preferably taken as preliminary light emission and not used for measurement, as in step 12. In the case where the waveform of the first light emission pulse is not different or less different from the waveform of the other light emission pulses, the first light emission pulse may be used for measurement as in step 17.

Second Exemplary Embodiment

In the first exemplary embodiment, the control section 50 controls the control potential $V_C$ to different potentials (the potential $V_L$ and the potential $V_H$). In a second exemplary embodiment, the control section 50 does not set one of the potentials to a specific potential, but sets it to a floating state. The floating state is occasionally called "float (float state)" or "floating (floating state)". The potential in the floating state is indicated as "Hi-Z".

Figure 15:
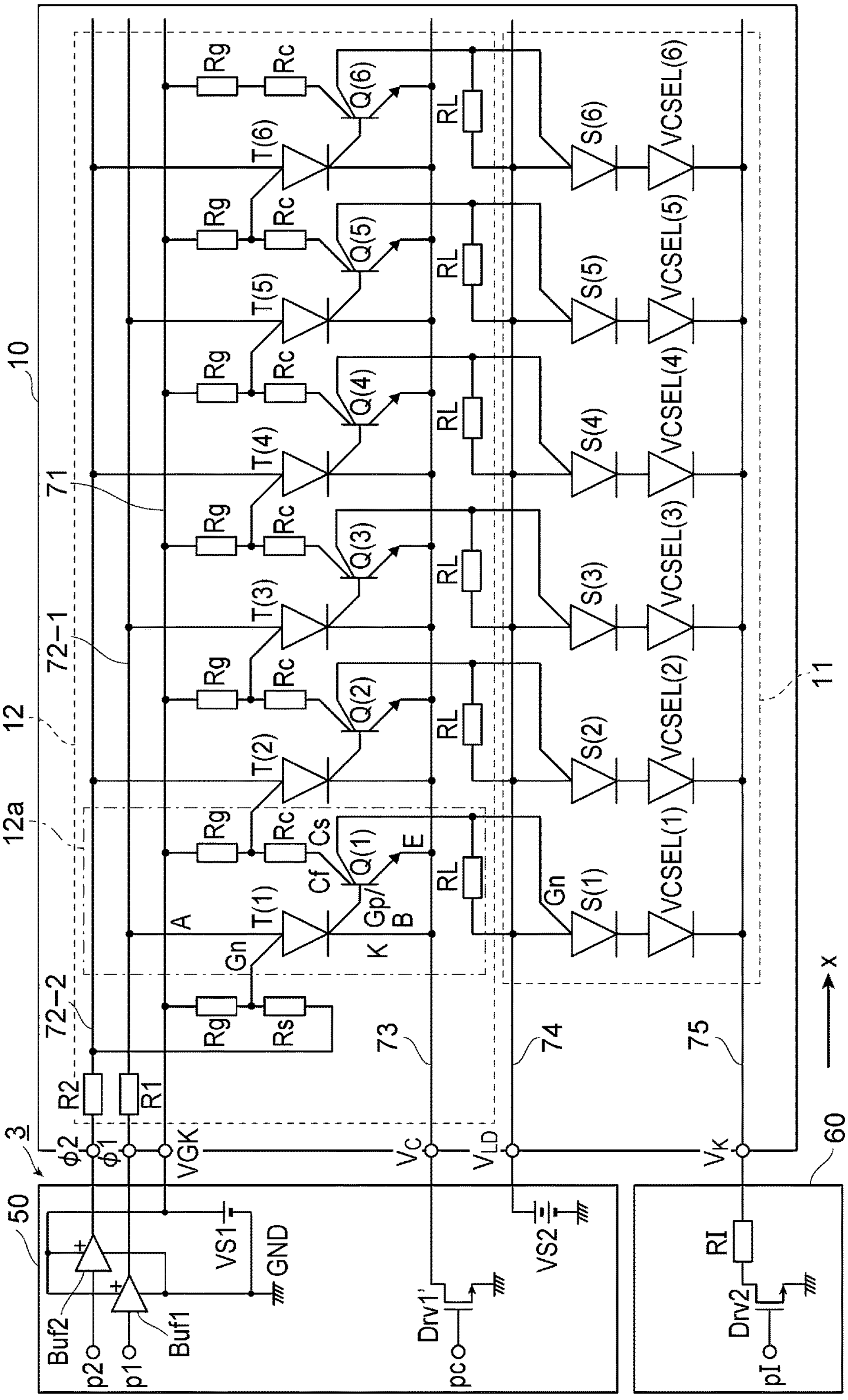
FIG. 15 illustrates a circuit that is equivalent to a light emitting device according to a second exemplary embodiment.

FIG. 15 illustrates a circuit that is equivalent to a light emitting device 3 according to the second exemplary embodiment. The light emitting device 3 includes a driver Drv1' in place of the driver Drv1 in the control section 50 of the light emitting device 1 illustrated in FIG. 3. The driver Drv1' includes an NMOS transistor as a driver element, for example. The other components are the same as those of the light emitting device 1.

The source of the NMOS transistor of the driver Drv1' is grounded, and the drain thereof is connected to the $V_C$ terminal, to which the control potential $V_C$ is supplied. A control signal pc that is at "H" (5 V) or "L" (0 V) is supplied to the gate of the driver Drv1'. The driver Drv1' is turned ON and the control potential $V_C$ is brought to the ground potential GND (0 V) when the control signal pc is at "H" (5 V), and the driver Drv1' is turned OFF and the control potential $V_C$ is brought to the floating state (Hi-Z) when the control signal pc is at "L" (0 V).

Figures 16A, 16B, 16C, 16D:
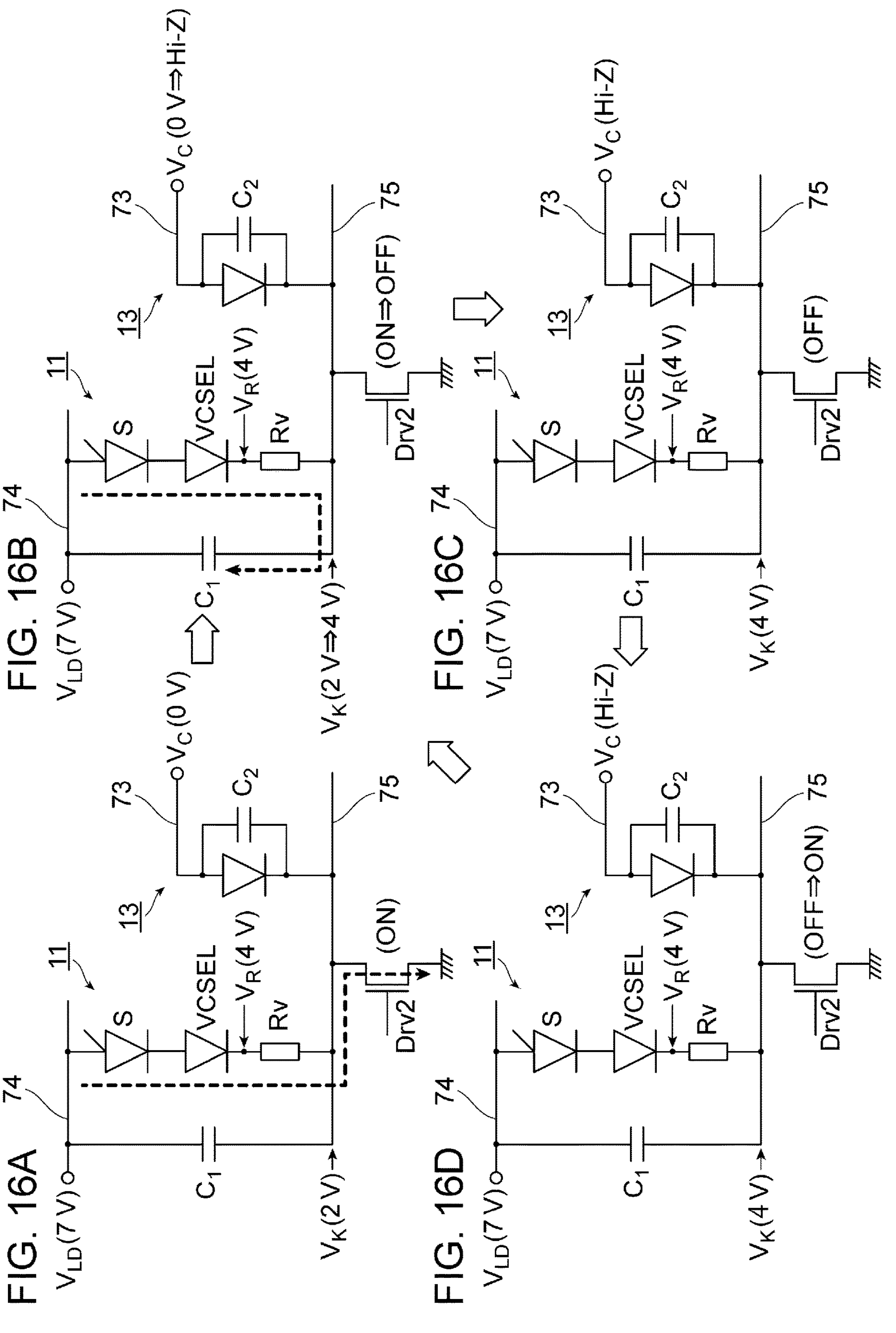

FIGS. 16A to 16D illustrate operation of the light emitting device 3 according to the second exemplary embodiment. FIG. 16A illustrates a case where the driver Drv2 is turned on, FIG. 16B illustrates a case where the driver Drv2 is switched from on to off, FIG. 16C illustrates a case where the driver Drv2 is turned off, and FIG. 16D illustrates a case where the driver Drv2 is switched from off to on. It is assumed that the light emitting potential $V_{LD}$ is 7 V. The path of the light emission current is indicated by the broken line.

In the case where the driver Drv2 is turned on, as illustrated in FIG. 16A, a VCSEL caused to emit light by causing the shift section 12 to operate has just been selected. Therefore, the control potential $V_C$ is the ground potential GND (0 V). That is, the drawing is in the same state as FIG. 8A.

When the driver Drv2 is switched from on to off, as illustrated in FIG. 16B, the control potential $V_C$ is set from 0 V to the floating potential (Hi-Z). Then, the light emission current that has been flowing through the light emission control thyristor S, the VCSEL, and the internal resistor Rv, which are connected in series with each other, is blocked from flowing to the capacitor $C_2$f and flows toward the capacitor $C_1$.

That is, the light emission current falls with a time constant $C_1 \times Rv$ determined in accordance with the capacitor $C_1$ and the internal resistor Rv. This time constant is smaller than the time constant $(C_1+C_2) \times Rv$ for the case where the control potential $V_C$ is set to the ground potential GND (0 V) indicated in FIG. 8B.

When the substrate potential $V_K$ is brought to 4 V when the driver Drv2 is turned off, as illustrated in FIG. 16C, the light emission control thyristor S is switched from the on state to the off state, and the VCSEL stops emitting light (light is extinguished). In this state, which is similar to FIG. 8C, the control potential $V_C$ is maintained at the floating potential (Hi-Z).

As illustrated in FIG. 16D, the driver Drv2 is switched from on to off. At this time, the control potential $V_C$ is maintained at the floating potential (Hi-Z). Then, the light emission current rises with a time constant determined in accordance with the capacitor $C_1$ and the on resistance of the driver Drv2. The on resistance of the driver Drv2 is smaller than the resistance of the internal resistor Rv. Hence, the light emission current rises more rapidly than when it falls.

After that, the process returns to FIG. 16B. That is, the control potential $V_C$ is set to the floating potential (Hi-Z) while the VCSEL generates a plurality of continuous light emission pulses.

Figure 17A:
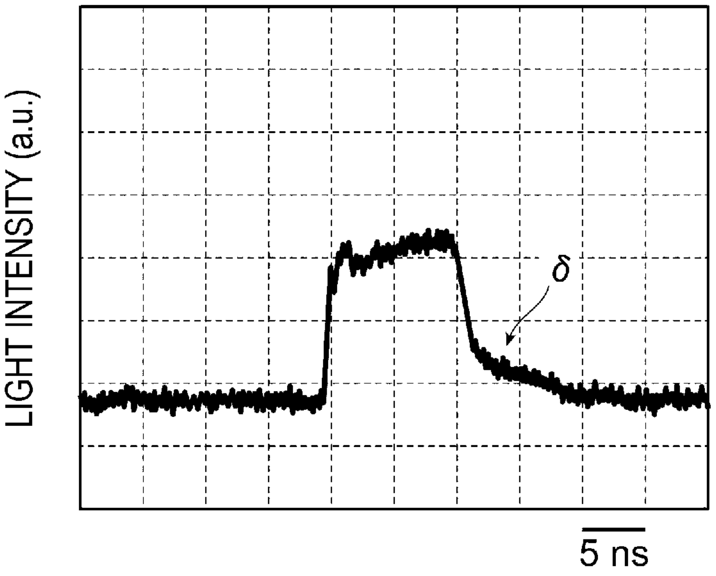
Figure 17B:
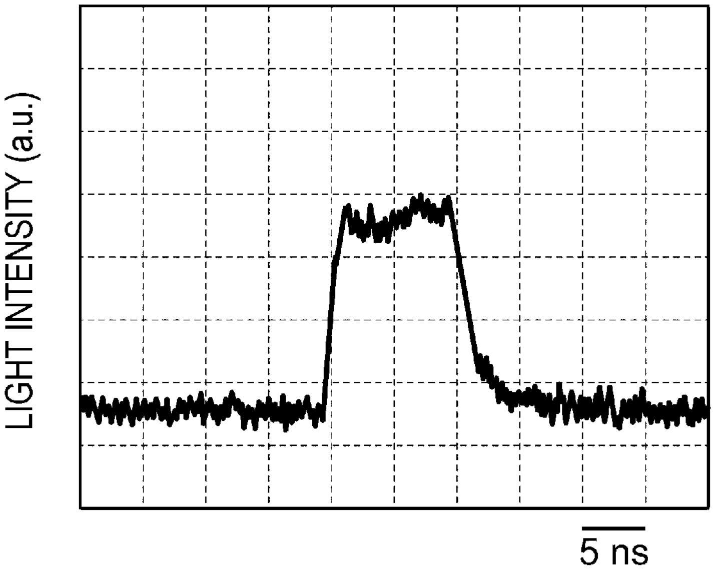

FIGS. 17A and 17B illustrate the waveform of light emission pulses from the VCSEL in the light emitting device 3. FIG. 17A illustrates a case where the control potential $V_C$ is maintained at the ground potential GND (0 V) when the driver Drv2 is turned off, and FIG. 17B illustrates a case where the control potential $V_C$ is set to the floating potential (Hi-Z) when the driver Drv2 is turned off. Similarly to FIGS. 6A, 6B, and 6C, the horizontal axis represents the time with each scale indicating 5 ns, and the vertical axis represents the light intensity (a.u.).

In the case where the control potential $V_C$ is set to the ground potential GND (0 V), as indicated in FIG. 17A, a shoulder is seen at fall of the light emission pulses (portion indicated by the arrow δ), as in FIG. 6A. On the other hand, in the case where the control potential $V_C$ is set to the floating potential (Hi-Z), as indicated in FIG. 17B, a shoulder is not seen at fall of the light emission pulses.

Measurement Flowchart according to Second Exemplary Embodiment

Next, a measurement flowchart according to the second exemplary embodiment will be described.

Figure 18:
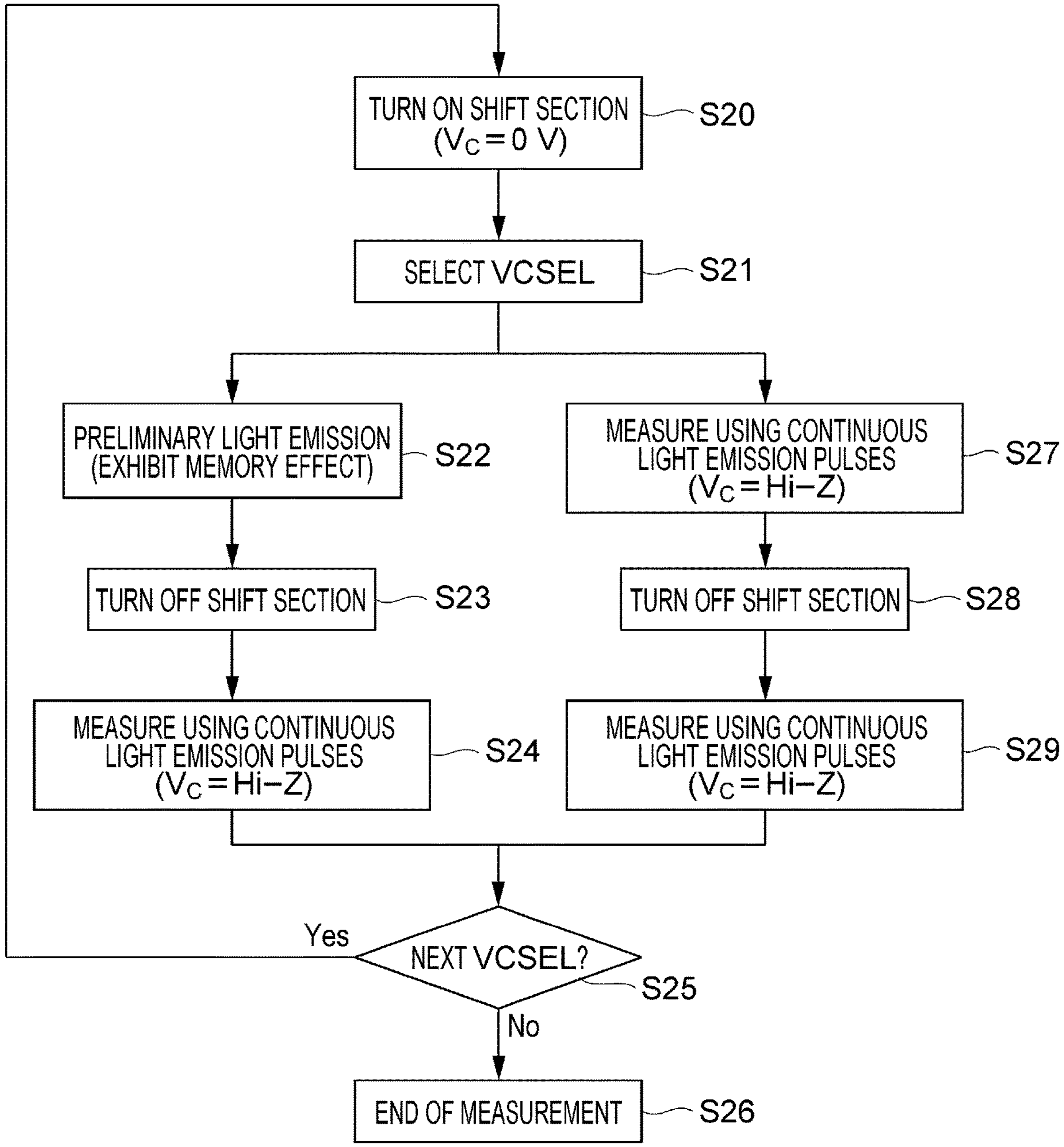
FIG. 18 is a measurement flowchart according to the second exemplary embodiment.

FIG. 18 is a measurement flowchart according to the second exemplary embodiment.

There are a plurality of flows for operation of the light emitting device 3. The flow on the left side is described.

In step 20, the control section 50 turns on the shift section 12. That is, the light emitting device 1 is set to the initial state discussed earlier. At this time, the control potential $V_C$ is set to the ground potential GND (0 V) ($V_L$=0 V). In step 21, the control section 50 selects a VCSEL to be caused to emit light by causing the shift section 12 to operate. Steps 20, 21 are the same as steps 10, 11, respectively, in FIG. 14A.

In step 22, the drive section 60 causes the selected VCSEL to emit light. At this time, the control potential $V_C$ is 0 V. A memory effect is exhibited by this light emission. This light emission is not used for measurement, and therefore is expressed as "preliminary light emission". Step 22 is the same as step 12 in FIG. 14A.

In step 23, the control section 50 turns off the shift section 12. As discussed earlier, the shift signals p1, p2 are brought to "L" (0 V), for example.

In step 24, the drive section 60 turns on and off the driver Drv2, and causes the VCSEL to continuously generate a plurality of light emission pulses (continuous light emission pulses). Light reflected from the object to be measured for the light emission pulses is received by the 3D sensor 5 (see FIG. 1), and charge corresponding to the light emission pulses is stored in a capacitor in the 3D sensor 5. The distance to the object to be measured is measured from the charge stored in accordance with the continuous light emission pulses. At this time, the control section 50 sets the control potential $V_C$ to the floating potential (Hi-Z). It is only necessary that the timing to set the control potential $V_C$ to the floating potential (Hi-Z) should be before light emission from the first VCSEL in step 24 is ended. A period for which a plurality of light emission pulses are continuously generated is defined as "light emission time". That is, the control section 50 sets the control potential $V_C$ to the ground potential GND (0 V) during a shift period (when selection is made) in which the shift section 12 performs shift operation, and sets the control potential $V_C$ to a potential (the floating potential (Hi-Z)) that is different from the value during the period (when selection is made) during the light emission time.

In step 25, the control section 50 determines whether or not to cause the next VCSEL to emit light. Steps 25 and later are the same as steps 15 and later, respectively, in FIG. 14A.

Next, the flow on the right side is described.

Step 27 and step 29 are consecutive steps, although the steps are indicated as separate steps. As in step 24, the drive section 60 turns on and off the driver Drv2, causes the VCSEL to generate continuous light emission pulses, and measures the distance to the object to be measured. At this time, the control section 50 sets the control potential $V_C$ to the floating potential (Hi-Z). A memory effect is exhibited once the VCSEL is caused to emit light. Hence, the VCSEL is caused to generate continuous light emission pulses. It is only necessary that the timing to set the control potential $V_C$ to the floating potential (Hi-Z) should be before light emission from the first VCSEL in step 27 is ended.

In step 28, the control section 50 turns off the shift section 12 quickly after the VCSEL emits light in step 17. A memory effect is exhibited once the VCSEL is caused to emit light in step 27. Hence, the shift section 12 is preferably turned off quickly after light emission from the VCSEL in step 27.

After that, the processes in and after step 25 discussed earlier are executed.

Here, the control potential $V_C$ is brought to the floating potential (Hi-Z). However, the control potential $V_C$ may not necessarily be brought to the floating potential (Hi-Z). It is only necessary that the control potential $V_C$ should be a potential that suppresses the light emission current flowing through the capacitor $C_1$ and the capacitor $C_2$ in the state of being connected in parallel with each other (parallel connection state when the light emission pulses fall. For example, the control potential $V_C$ may be a potential that applies a forward bias to the pn junction that constitutes the capacitor $C_2$ of the capacitor section 13 (pn junction formed by the n-type semiconductor layer 81 and the p-type semiconductor layer 83).

In the first exemplary embodiment and the second exemplary embodiment, the light emitting devices are VCSELs, and one series connection of a light emission control thyristor S and a VCSEL is connected to one shift unit 12*a*. However, a plurality of series connections of light emission control thyristors S and VCSELs may be connected to one shift unit 12*a*. Alternatively, a plurality of VCSELs may be provided for one light emission control thyristor S. A plurality of VCSELs are selected at the same time by one shift unit 12*a*, and emit light concurrently.

While the light emitting elements (VCSELs) are illustrated as arranged one-dimensionally in FIGS. 3 and 5A, the light emitting elements may be arranged two-dimensionally. For example, when the light emitting elements are arranged two-dimensionally in the light source 10, the light emitting elements are caused to emit light in correspondence with the irradiated areas 210 which are arranged two-dimensionally.

In the first exemplary embodiment and the second exemplary embodiment, the shift section 12 is used as a select section that selects light emitting elements (VCSELs) to be caused to emit light. However, the select section may not be constituted from the shift section which performs shift operation, and a driver may directly send a signal to the thyristors of the light emitting elements.

While the light source 10 discussed above has a common cathode, the light source 10 may have a common anode. While an n ohmic electrode is provided in the n gate layer (n-type semiconductor layer 87) at this time, a p ohmic electrode may be provided in the p gate layer (p-type semiconductor layer 86).

While the shift thyristors T are connected to each other by the coupled transistor Q in the shift section 12 of the light source 10, the shift thyristors T may be connected to each other by a diode or a resistor.

While the light emitting section and the capacitor section are provided on a single semiconductor substrate in the first exemplary embodiment and the second exemplary embodiment, a capacitor section provided on a different substrate may be connected to a light emitting section through wires, or a light emitting section and a capacitor section provided on the same substrate may be configured not to have a common layer.

While the control potential $V_C$ is controlled to different potentials in correspondence with whether the driver Drv2 is on or off in the first exemplary embodiment, the potential may be switched in the middle of switching between potentials, even if switching is not completed at the first light emission, in the case where light emission is performed a plurality of times, for example.

Specifically, the potential may be both 0 V and 3.3 V when light is emitted. Even in that case, the potential is set to 0 V when selection is made. That is, the capacitor section may be constituted from a select section that selects a light emitting element to be caused to emit light; and when different potentials are set during light emission in which the selected light emitting element is caused to emit light and during selection in which the select section selects a light emitting element to be caused to emit light in the light emitting section, the same potential as the potential during selection may be set for a certain period during light emission in which the selected light emitting element is caused to emit light.

While the control potential $V_C$ may be frequently switched only in the case where a charge tends to be stored along with light emission in the case where the potential is controlled to different potentials during light emission, the control potential $V_C$ may be switched in certain lengths of periods, in order to avoid complication of drive. That is, the capacitor section may be constituted from a select section that selects a light emitting element to be caused to emit light; and different potentials may be set during lengths of periods, in which the selected light emitting element is caused to emit light consecutively a plurality of times etc. and during selection in which the select section selects a light emitting element to be caused to emit light in the light emitting section.

While exemplary embodiments of the present disclosure have been described above, the present disclosure may be modified variously without departing from the scope and spirit of the present disclosure.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A light emitting device comprising:

a light emitting section that includes a light emitting element provided on a semiconductor substrate;

a capacitance section connected to the light emitting section;

a select section that selects the light emitting element to be caused to emit light; and a control section that controls a potential of the capacitance section when the light emitting element of the light emitting section emits light, wherein the capacitance section is constituted of a pn junction that is a structure that is equivalent to the light emitting element provided on the semiconductor substrate, wherein the select section comprises a shift thyristor and is stacked on the capacitance section, wherein the capacitance section does not function as a light emitting element, and the control section applies, to the capacitance section, a potential that does not apply a forward bias to the pn junction when a light emission current flowing through the light emitting section is on.

2. The light emitting device according to claim 1, wherein the control section sets the potential of the capacitance section to a first potential when a light emission current flowing through the light emitting section is on, and the control section sets the potential of the capacitance section from the first potential to a second potential that is higher in absolute value than the first potential when the light emission current flowing through the light emitting section is turned from on to off.

3. The light emitting device according to claim 2, further comprising:

a drive section connected to the light emitting section and the capacitance section to turn on or off the light emission current flowing through the light emitting section, wherein the control section sets the potential of the capacitance section from the first potential to the second potential in accordance with a timing when the drive section turns the light emission current from on to off.

4. A measurement apparatus that measures a three-dimensional shape of an object to be measured, the measurement apparatus comprising:

the light emitting device according to claim 3; and a light receiving section that receives light output from the light emitting section of the light emitting device and reflected by the object to be measured.

5. The light emitting device according to claim 2, wherein the light emitting section has a first capacitance in parallel with the light emitting element, the capacitance section has a second capacitance, and the first potential or the second potential is a potential at which a displacement current flows through the first capacitance and the second capacitance in a series connection state.

6. The light emitting device according to claim 5, wherein the second capacitance has a capacitance value that is as much as that of the first capacitance or more.

7. A measurement apparatus that measures a three-dimensional shape of an object to be measured, the measurement apparatus comprising:

the light emitting device according to claim 6; and a light receiving section that receives light output from the light emitting section of the light emitting device and reflected by the object to be measured.

8. The light emitting device according to claim 6, wherein the second capacitance has a capacitance value that is four times as much as that of the first capacitance or less.

9. A measurement apparatus that measures a three-dimensional shape of an object to be measured, the measurement apparatus comprising:

the light emitting device according to claim 8; and a light receiving section that receives light output from the light emitting section of the light emitting device and reflected by the object to be measured.

10. A measurement apparatus that measures a three-dimensional shape of an object to be measured, the measurement apparatus comprising:

the light emitting device according to claim 5; and a light receiving section that receives light output from the light emitting section of the light emitting device and reflected by the object to be measured.

11. A measurement apparatus that measures a three-dimensional shape of an object to be measured, the measurement apparatus comprising:

the light emitting device according to claim 2; and a light receiving section that receives light output from the light emitting section of the light emitting device and reflected by the object to be measured.

12. The light emitting device according to claim 1, wherein the light emitting section and the capacitance section are provided on a single semiconductor substrate, and the light emitting section and the capacitance section are connected to each other through the semiconductor substrate.

13. A measurement apparatus that measures a three-dimensional shape of an object to be measured, the measurement apparatus comprising:

the light emitting device according to claim 12; and a light receiving section that receives light output from the light emitting section of the light emitting device and reflected by the object to be measured.

14. The light emitting device according to claim 1, wherein the light emitting section includes a plurality of light emitting elements.

15. The light emitting device according to claim 14, wherein, during light emission in which the selected light emitting element is caused to emit light, the control section sets the capacitance section to a potential that is different from that during selection in which the select section selects the light emitting element to be caused to emit light.

16. The light emitting device according to claim 15, wherein the control section sets the potential of the capacitance section to a first potential when the select section makes the selection, and sets the potential of the capacitance section to a second potential that is higher in absolute value than the first potential when the select section has ended the selection.

17. The light emitting device according to claim 1, wherein the control section sets the potential of the capacitance section to a floating state during light emission.

18. A measurement apparatus that measures a three-dimensional shape of an object to be measured, the measurement apparatus comprising:

the light emitting device according to claim 1; and a light receiving section that receives light output from the light emitting section of the light emitting device and reflected by the object to be measured.

* * * * *